United States Patent
Matsumoto et al.

(10) Patent No.: US 6,277,663 B1
(45) Date of Patent: Aug. 21, 2001

(54) METHOD OF PRODUCING SEMICONDUCTOR LASER DIODE

(75) Inventors: Keisuke Matsumoto; Kazuhisa Takagi; Tohru Takiguchi, all of Tokyo (JP)

(73) Assignee: Mitsubishi Denki Kabushiki Kaisha, Tokyo (JP)

(*) Notice: Subject to any disclaimer, the term of this patent is extended or adjusted under 35 U.S.C. 154(b) by 0 days.

(21) Appl. No.: 09/395,956

(22) Filed: Sep. 14, 1999

(30) Foreign Application Priority Data

Mar. 16, 1999 (JP) .................................................. 11-070242

(51) Int. Cl.[7] .................................................. H01L 21/00
(52) U.S. Cl. .................. 438/22; 438/39; 438/29; 438/40; 438/47
(58) Field of Search .................................. 438/31, 32, 39, 438/40, 41, 22, 29

(56) References Cited

U.S. PATENT DOCUMENTS

| | | | |
|---|---|---|---|
| 5,316,967 | * | 5/1994 | Kaneno et al. . |
| 5,789,275 | | 8/1998 | Lee et al. .............................. 438/40 |

FOREIGN PATENT DOCUMENTS

| | | |
|---|---|---|
| 10-253846 | 9/1998 | (JP) . |
| 2828628 | 9/1998 | (JP) . |

* cited by examiner

*Primary Examiner*—Tuan H. Nguyen
(74) *Attorney, Agent, or Firm*—Leydig, Voit & Mayer, Ltd.

(57) ABSTRACT

A semiconductor laser diode includes a mesa having a width on a semiconductor substrate and aligned with a direction of resonance, a current blocking layer formed by selective growth on both sides of the mesa and having a first embedded layer and a second embedded layer covering the first embedded layer.

9 Claims, 25 Drawing Sheets

METHOD OF PRODUCING SEMICONDUCTOR LASER DIODE

BACKGROUND OF THE INVENTION

1. Field of the Invention

The present invention relates to a method of producing a semiconductor laser diode used mainly in optical communications and particularly an embedded double junction semiconductor laser diode based on InP and that has a current blocking layer.

2. Description of the Related Art

Semiconductor laser diodes that have embedded layers based on InP on both sides of a mesa have been used as the light source for optical communications. FIGS. 26A–26D are schematic diagrams for explaining the respective steps in the production of the semiconductor laser diode of a conventional example (hereinafter referred to as a first conventional example). The semiconductor laser diode of the conventional example has been produced by forming an n cladding layer 2 made of n-InP, an active layer 3 and a p cladding layer 4 made of p-InP successively on a substrate 1 made of n-InP as shown in FIG. 26A. Thereafter, as shown in FIG. 26B, an oxide film 205 is formed on a portion where a mesa is to be formed, and the other portion is etched away thereby forming the mesa. During this etching step, so-called undercut occurs below both edges of the oxide film 205, causing the edges of the oxide film 205 to project in a manner of overhang on both sides.

Then a p-InP layer 206 and an n-InP layer 207 are grown on both sides of the mesa as shown in FIG. 26C, and the oxide film 205 is removed while forming a p contact layer 8 and a contact layer 9 as shown in FIG. 26D. The semiconductor laser diode of the first conventional example thus produced has a problem of a current leakage path 210 being formed as shown in FIG. 26D that allows current leakage. A method of producing a semiconductor laser diode (hereinafter referred to as a second conventional example) that minimizes the current leakage is disclosed, for example, in the Japanese Patent No. 2828628. The production method disclosed in the Japanese Patent No. 2828628 comprises forming the n cladding layer 2 made of n-InP, the active layer 3 and the p cladding layer 4 made of p-InP successively on the substrate 1 made of n-InP as shown in FIG. 27A, followed by the formation of a nitride film 211 and an oxide film 212 on the p cladding layer 4 that is made of p-InP.

Then as shown in FIG. 27B, a photosensitive film 213 is formed on a portion where a mesa is to be formed, and the nitride film 211 and the oxide film 212 are etched away by using the photosensitive film 213 as a mask in a wet etching step using hydrofluoric acid, thereby forming a nitride film 211a and an oxide film 212a. In this wet etching step, since the etching rate is higher for the oxide film than for the nitride film, the oxide film 211a becomes smaller than the nitride film 212a as shown in FIG. 27B. Then as shown in FIG. 27C, the photosensitive film 213 is removed and the mesa is formed by etching with the nitride film 211a and the oxide film 212a as the mask. During this etching step, undercut occurs below both edges of the nitride film 211a, making the nitride film 211a wider than the width of the mesa as shown in FIG. 27A, and therefore protruding edges are formed similarly to the first conventional example.

Then as shown in FIG. 28A, the protruding edges of the nitride film 211a are removed through dry etching by making use of the fact that the etching rate is higher for the nitride 211a film than for the oxide film 212a in dry etching. Thereafter, as shown in FIG. 28B, a p-InP layer 214 and an n-InP layer 215 are grown on both sides of the mesa, followed by removal of the oxide film 212a and the nitride film 211a thereby to form a p contact layer 216 and a contact layer 217 as shown in FIG. 28C. In the semiconductor laser diode of the second conventional example thus produced, leakage current is less than that in the semiconductor laser diode of the first conventional example.

However, the semiconductor laser diode of the first conventional example had such a problem that the leakage current cannot be reduced as described above.

There was also a problem that an active layer is exposed on side faces of the mesa during dry etching of the protruding edges of the nitride film, resulting in a possibility of lowering the reliability of the active layer 3.

SUMMARY OF THE INVENTION

An object of the present invention is to provide a method of producing the semiconductor laser diode that has high reliability with minimized leakage current.

In order to achieve the object described above, the present invention provides a method of producing the first semiconductor laser diode having a mesa of a predetermined width formed on the semiconductor substrate with the longitudinal direction thereof being aligned with the direction of resonance and the current block layer formed by selective growth on both sides of the mesa, which comprises:

forming a two-stage mask comprising a first mask of $SiO_2$ in contacting with the top semiconductor layer of semiconductor layers formed on a semiconductor substrate and a second mask of SiN with width different from that of the first mask, forming said mesa by etching said semiconductor layers positioned at both sides of said two-stage mask, forming a selective growth mask by etching said two-stage mask to make the width equal to the smaller width of said first mask and said second mask, and selectively growing said current block layer on both sides of said selective growth mask.

With this method, optimum mask can be used in the etching step to form the mesa and in the selective growth step, and therefore it is made possible to form the current block layer having sufficient width in the vicinity of the mesa. As a consequence, according to the method of producing the first semiconductor laser diode of the present invention, the semiconductor laser diode with less leakage current can be produced.

In the method of producing the first semiconductor laser diode according to the present invention, width of the first mask may be made larger than that of the second mask.

In the method of producing the first semiconductor laser diode according to the present invention, width of the first mask may also be made smaller than that of the second mask.

The present invention provides a method of producing the fourth semiconductor laser diode having a mesa of a predetermined width formed on a semiconductor substrate with a longitudinal direction thereof being aligned with the direction of resonance and a current block layer formed by selective growth on both sides of the mesa, wherein a selective growth mask comprising a first mask and a portion made of a different material is made by forming the portion of different material, having thermal expansion coefficient different from that of the first mask, on at least part of the first mask that is formed in contact with the mesa.

This makes it possible to prevent the shape of the selective growth mask from deforming thus accelerating the selective growth in the vicinity of the mesa during selective growth, and prevent the selective growth mask from deforming thus impeding the selective growth in the vicinity of the mesa.

The different material mentioned in this specification refers not only to those of different composition but also to those having the same composition but different crystalline structure or internal deformation.

Therefore it is made possible to prevent such a deformation of the selective growth mask that accelerates the selective growth in the vicinity of the mesa during selective growth, or prevent such a deformation of the selective growth mask that impedes the selective growth in the vicinity of the mesa, and it is made possible to form the current block layer having sufficient thickness in the vicinity of the mesa. As a consequence, the semiconductor laser diode with less leakage current can be produced.

In the method of producing the fourth semiconductor laser diode according to the present invention, it is preferable to select the different material from those having thermal expansion coefficient lower than that of the first mask material and form the different material layer over substantially the entire surface of the first mask. This configuration makes it possible to warp the selective growth mask so that the space between the substrate and the selective growth mask is enlarged at a high temperature during the selective growth step, thus causing a stock material gas to be supplied sufficiently to the portion where selective growth is desired.

Therefore it possible to form the current block layer having sufficient thickness in the vicinity of the mesa. As a consequence, the semiconductor laser diode with less leakage current can be produced.

In the method of producing the fourth semiconductor laser diode according to the present invention, the different material portion may also be formed in the form of a plurality of strips that are parallel to each other and are at right angles with the direction of resonance.

This configuration makes it possible to prevent the selective growth mask from deforming thus impeding the selective growth in the vicinity of the mesa during the selective growth step and to prevent the stock material gas supply to the portion where selective growth is to be carried out from being impeded.

Therefore selective growth can be carried out while preventing the current block layer from being thinned in the vicinity of the mesa. As a consequence, the semiconductor laser diode with less leakage current can be produced.

The present invention provides a method of producing the sixth semiconductor laser diode having a mesa of a predetermined width formed on a semiconductor substrate with a longitudinal direction thereof being aligned with the direction of resonance and a current block layer formed by selective growth on both sides of the mesa, which comprises the steps of:

forming a first embedded layer on both sides of said mesa by using a selective growth mask;

removing said selective growth mask after forming said first embedded layer;

growing a second semiconductor layer to such a thickness as the surface becomes substantially flat, on the mesa and on the first embedded layer on both sides of said mesa after removing the selective growth mask; and forming a second embedded layer on said first embedded layer on both sides of said mesa by etching said second semiconductor layer until the surface of said mesa is exposed.

This construction makes it possible to form the second embedded layer having relatively large thickness.

Therefore it is made possible to form the second embedded layer having relatively large thickness and the semiconductor laser diode with less leakage current can be produced.

In the method of producing the sixth semiconductor laser diode according to the present invention, it is preferable to further form an etching stopper layer on the mesa before forming the first embedded layer.

In the method of producing the sixth semiconductor laser diode according to the present invention, it is made possible to easily control the etching of the second embedded layer and control the thickness of the second embedded layer accurately, and the semiconductor laser diode with less leakage current can be produced.

In the method of producing the sixth semiconductor laser diode according to the present invention, an etching accelerating layer may also be formed on the mesa before forming the first embedded layer.

In the method of producing the sixth semiconductor laser diode, it is made possible to easily control the etching of the second embedded layer and control the thickness of the second embedded layer accurately, and the semiconductor laser diode with less leakage current can be produced.

DESCRIPTION OF THE PREFERRED EMBODIMENTS

Figure 1:
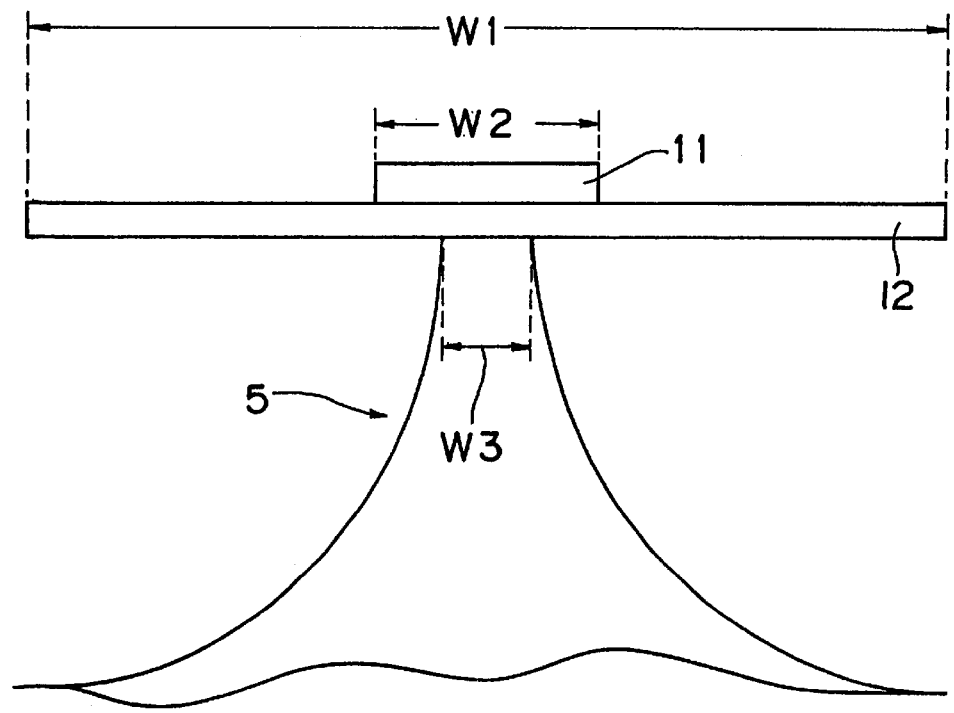
FIG. 1 is a schematic diagram showing a two-stage mask used in mesa etching during the production process of the semiconductor aer diode according to the first embodiment of the present invention.

Preferred embodiments of the present invention will be described below with reference to the accompanying drawings.

Embodiment 1

A semiconductor laser diode of the first embodiment according to the present invention is produced by, after forming a mesa 5 by using a double-layer mask comprising a first mask (oxide mask) 12 formed from $SiO_2$ in constant with a semiconductor layer and a second mask (nitride mask) 11 formed from SiN on the first mask with width smaller than that of the first mask 12, etching the two-stage mask to make the width thereof equal to the width of the second mask (nitride mask) 11 to form a selective growth mask, and growing a first embedded layer 14 and a second embedded layer 15 by using the selective growth mask, thereby to form a current block layer 7 comprising the first embedded layer 14 and the second embedded layer 15.

In the first embodiment, in case the mesa 5 with top surface width of about 1 $\mu$m is to be formed, for example, width W1 of the oxide mask 12 is set to 5 to 7 $\mu$m and width W2 of the nitride mask 11 is set to 3 to 4 $\mu$m.

Figure 2:
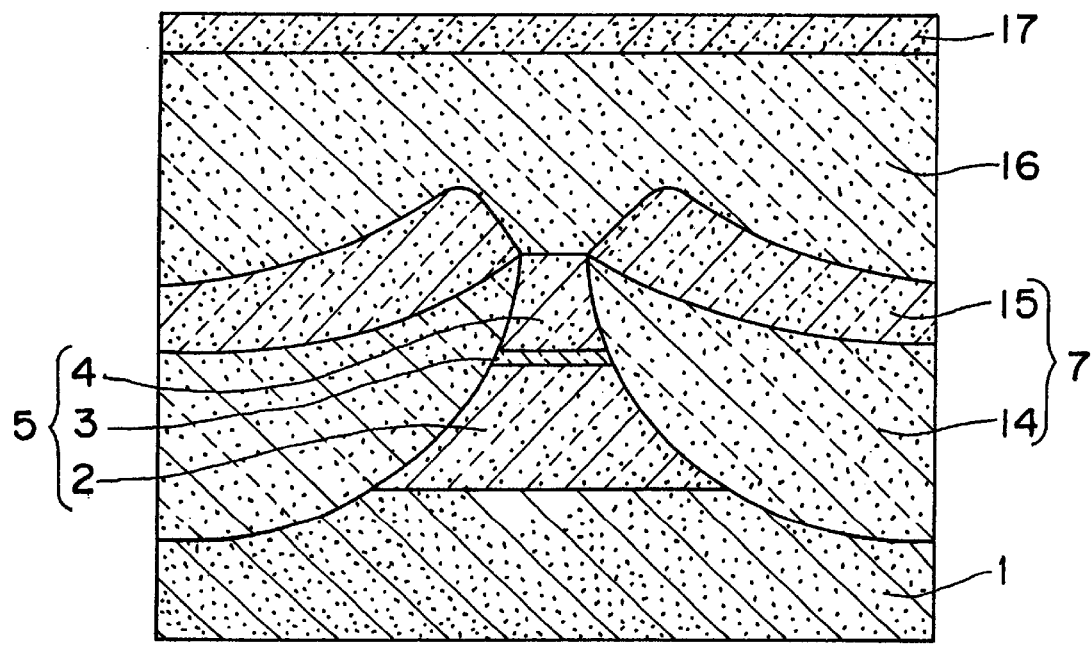
FIG. 2 is a schematic sectional view showing the semiconductor layer configuration of the semiconductor laser diode according to the first embodiment of the present invention.

In the semiconductor laser diode of the first embodiment produced by using the double-layer mask as described above, the current block layer 7 comprising the first embedded layer 14 and the second embedded layer 15 that are formed on both sides of the mesa 5 can be formed so that the second embedded layer 15 covers the entire top surface of the first embedded layer 14 as shown in FIG. 2. Consequently, formation of leakage current path can be prevented with minimized leakage current in the semiconductor laser diode of the first embodiment.

A method of producing the semiconductor laser diode according to the first embodiment of the present invention will be described in detail below.

Figure 3A:
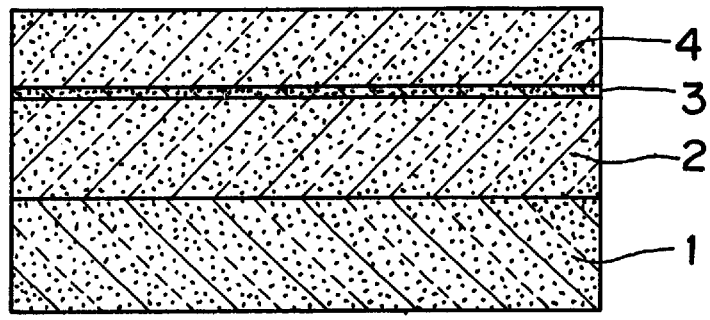
FIG. 3A is a schematic sectional view after growing a p-cladding layer during the production process of the semiconductor laser diode according to the first embodiment of the present invention.
Figure 3B:
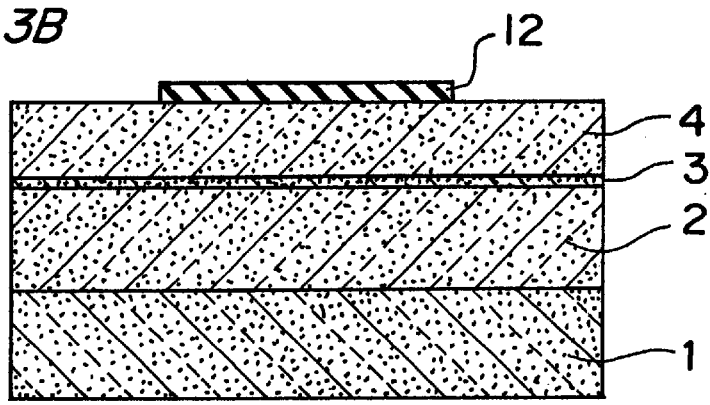
FIG. 3B is a schematic sectional view after forming a oxide film mask during the production process of the semiconductor laser diode according to the first embodiment of the present invention.

In the method of producing the semiconductor laser diode according to the first embodiment, first, an n cladding layer 2 made of n-InP, an active layer 3 and a p cladding layer 4 made of p-InP are formed successively on a substrate 1 made of n-InP as shown in FIG. 3A. Then after forming an oxide film made of $SiO_2$ on the p cladding layer 4, the oxide film is etched to leave the oxide film on a portion where a mesa is to be formed, thereby forming an oxide mask 12 made of silicon oxide, as shown in FIG. 3B.

The oxide mask 12 is made wider than the mesa 5 to allow the mesa 5 of desired width to be formed. In case the mesa with top surface width of about 1 μm is to be formed, for example, width of the oxide mask is set to 5 to 7 μm.

Figure 3C:
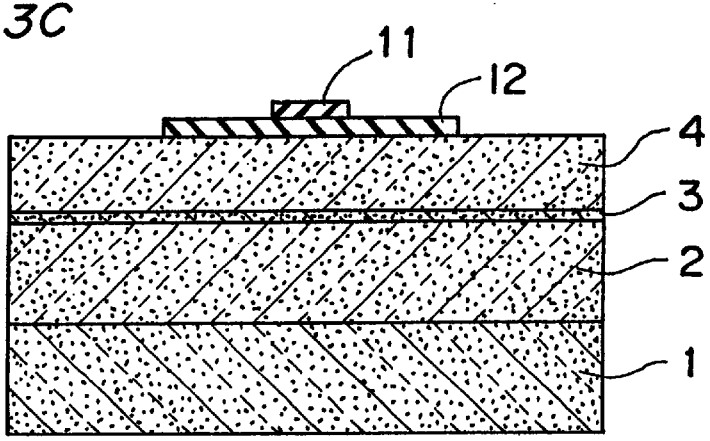
FIG. 3C is a schematic sectional view after forming a nitride mask during the production process of the semiconductor laser diode according to the first embodiment of the present invention.

Then a nitride film made of SiN is formed on the oxide mask 12, and a nitride mask 11 having width smaller than that of the oxide mask 12 is formed over the portion where a mesa is to be formed as shown in FIG. 3C.

Width of the nitride mask 11 is set so that the flow of stock material gas will not be impeded when growing the first embedded layer 14 made of semi-insulating InP (Fe-doped InP or the like) or p-InP and the second embedded layer 15 made of n-InP.

In case the mesa 5 with top surface width of about 1 μm is to be formed, for example, width of the nitride mask 11 is set to 3 to 4 μm.

Figure 4A:
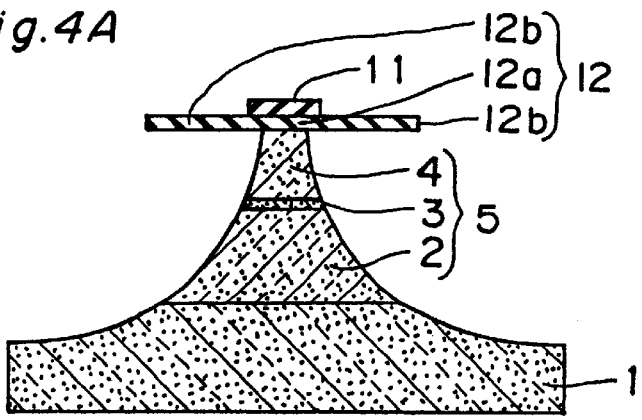
FIG. 4A is a schematic sectional view after etching to form the mesa during the production process of the semiconductor laser diode according to the first embodiment of the present invention.

Next, the two-stage mask comprising the nitride mask 11 and the oxide mask 12 is used as a mask in etching to form the mesa 5 shown in FIG. 4A. Thus the mesa that corresponds to the width of the oxide mask 12 is formed.

Figure 4B:
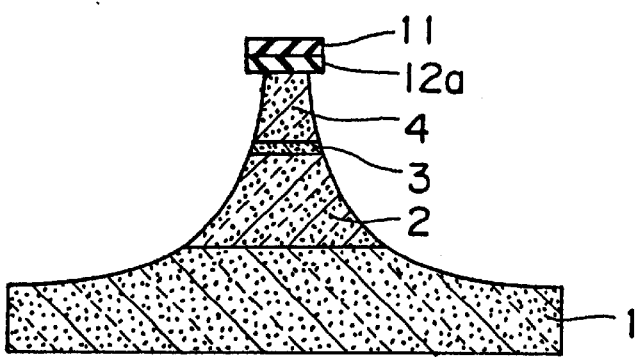
FIG. 4B is a schematic sectional view after re moving protruding portions of an oxide mask during the production process of the semiconductor laser diode according to the first embodiment of the present invention.
Figure 4C:
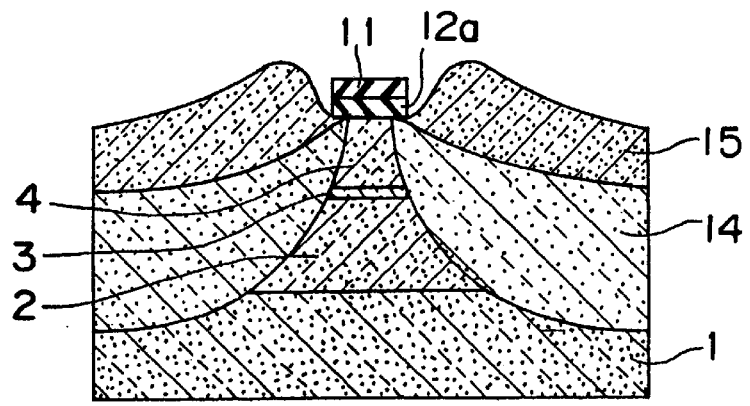
FIG. 4C is a schematic sectional view after growing the embedded layer during the production process of the semiconductor laser diode according to the first embodiment of the present invention.

Then as shown in FIG. 4B, protruding portions 12b of the oxide film 12 protruding beyond the nitride film 11 are removed by selective etching in a wet etching process using hydrofluoric acid or the like.

The insulating film mask, comprising the oxide mask 12a with the protruding portions 12b removed and the nitride mask 11 laminated on one another, is used as a selective growth mask for growing the first embedded layer 14 made of semi-insulating InP (Fe-doped InP or the like) or p-InP and the second embedded layer 15 on both sides of the mesa.

Then after removing the oxide mask 12a and the nitride mask 11 located on the mesa by wet etching step using hydrofluoric acid or the like, a p-InP layer 16 and a contact layer 17 are formed as shown in FIG. 2.

Last, apelectrode (notshown) andanelectrode (notshown) are formed thereby making the semiconductor laser diode of the first embodiment.

In the semiconductor laser diode of the first embodiment produced as described above, the mesa is formed by etching with the two-stage insulating film mask comprising the nitride mask 11 and the oxide mask 12 that is formed under the nitride mask 11 and has the protruding portions 12a protruding beyond the nitride mask 11, then the protruding portions 12a are removed by selective etching of the oxide mask 12 and the first embedded layer 14 and the second embedded layer 15 are formed. Thus since the protruding portions 12a that impede the growth of the second embedded layer 15 in the vicinity of the mesa are removed in the semiconductor laser diode of the first embodiment, the second embedded layer 15 can be grown up to near the mesa, thereby substantially eliminating the leakage current path.

Also according to the first embodiment, since two types of insulation mask, the nitride mask 11 and the oxide mask 12, are formed separately, the insulation masks can be formed with high precision and, as a result, the mesa can be formed with high precision.

Also according to the first embodiment, it is preferable to form the nitride mask 11 and the oxide mask 12 by dry etching, which makes it possible to formed the insulating film masks with even higher precision and, as a result, form the mesa more precisely.

Also because the oxide film 12 is removed by wet etching after forming the mesa, reliability of the element can be improved without causing damage to the side face of the active layer 3 of the mesa unlike in the case of dry etching.

According to the present invention, however, removal of the oxide film 12 is not limited to wet etching.

Also because the oxide film 12 is formed in contact with the top surface of the semiconductor layer (top surface of the mesa) in the first embodiment, the mesa 5 can be precisely etched. That is, according to the present invention, while a nitride mask made of SiN may be formed in contact with the semiconductor layer as described later for the third embodiment, in this case, bonding strength of the nitride mask and the semiconductor layer that is excessively high causes such a problem that the narrowest portion of the mesa does not agree with the top surface of the mesa, resulting in a bottle neck to be formed below the top of the mesa. According to the first embodiment, since the oxide mask is formed in contact with the semiconductor layer, such a problem can be eliminated.

Embodiment 2

FIGS. 5A–6C are schematic sectional views showing the steps of the method of producing the semiconductor laser diode according to the second embodiment of the present invention.

Figure 5A:
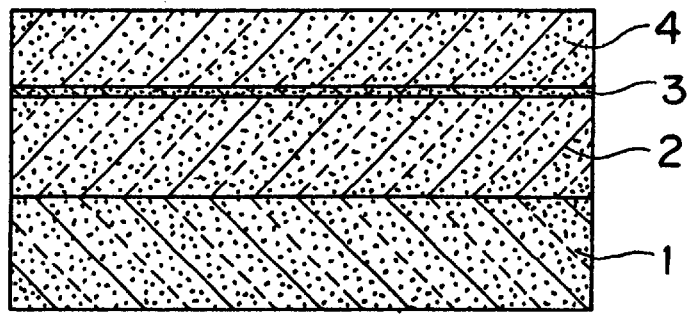
FIG. 5A is a schematic sectional view after growing the cladding layer during the production process of the semiconductor laser diode according to the second embodiment of the present invention.
Figure 5B:
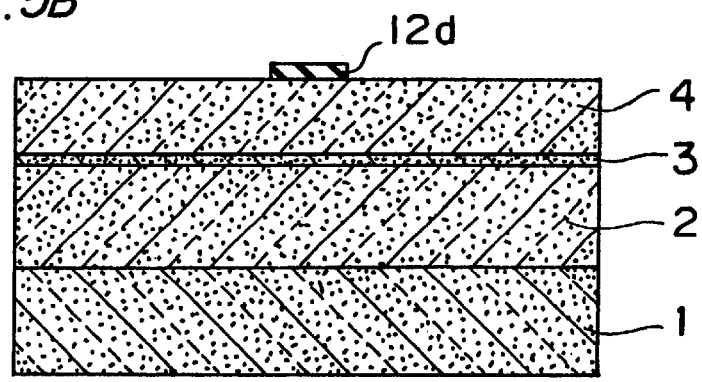
FIG. 5B is a schematic sectional view after forming the oxide film mask during the production process of the semiconductor laser diode according to the second embodiment of the present invention.
Figure 5C:
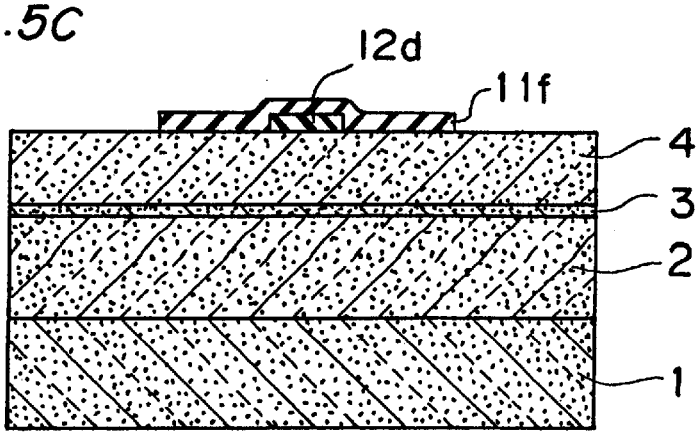
FIG. 5C is a schematic sectional view after forming the nitride film during the production process of the semiconductor laser diode according to the second embodiment of the present invention.

In the method of producing the semiconductor laser diode according to the third embodiment, first, the n cladding layer 2 made of n-InP, the active layer 3 and the p cladding layer 4 made of p-InP are formed successively on the substrate 1 made of n-InP as shown in FIG. 5A similarly to the first embodiment. Then an oxide film mask 12d made of silicon oxide is formed on the p cladding layer 4 in a portion where the mesa is to be formed, as shown in FIG. 5B. This is followed by the formation of a nitride film 11f made of SiN to cover the oxide mask 12d as shown in FIG. 5C. Width of the oxide mask 12d is set so that the flow of stock material gas will not be impeded when growing the first embedded layer 14 made of semi-insulating InP (Fe-doped InP or the like) or p-InP and the second embedded layer 15 made of n-InP. Width of the wider nitride mask 11f is set so as to enable the formation of the mesa having a desired shape, for example, in case the mesa with top surface width of about 1 μm is to be formed, width of the nitride mask 11f is set to 5 to 7 μm.

Figure 6A:
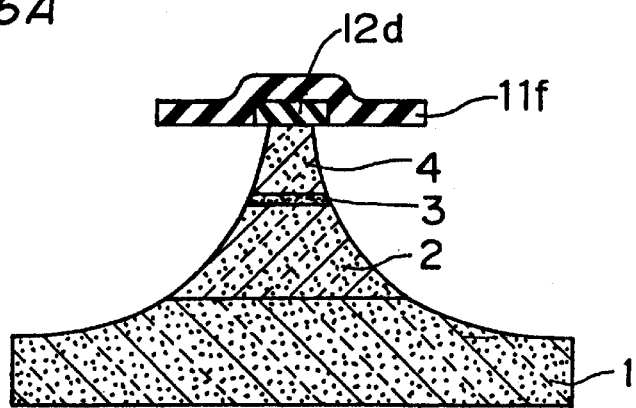
FIG. 6A is a schematic sectional view after etching to form the mesa during the production process of the semiconductor laser diode according to the second embodiment of the present invention.

Next, the two-stage mask comprising the oxide film mask 12d and the nitride film mask 11f formed to cover the oxide film mask 12d is used in etching to form the mesa shown in FIG. 6A.

Figure 6B:
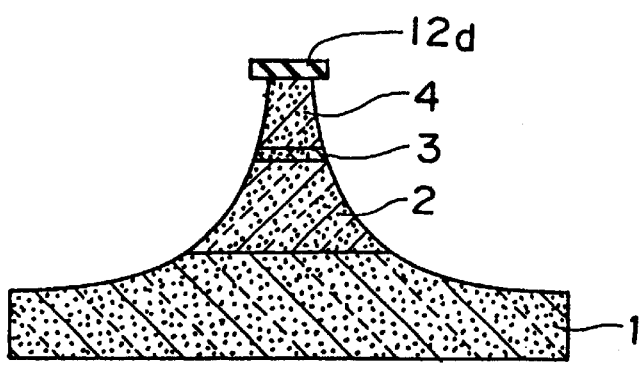
FIG. 6B is a schematic sectional view after removing protruding portions of oxide mask during the production process of the semiconductor laser diode according to the second embodiment of the present invention.

Then as shown in FIG. 6B, the nitride film 11f is removed by selective etching in a dry etching step such as $CF_4$ plasma etching.

Figure 6C:
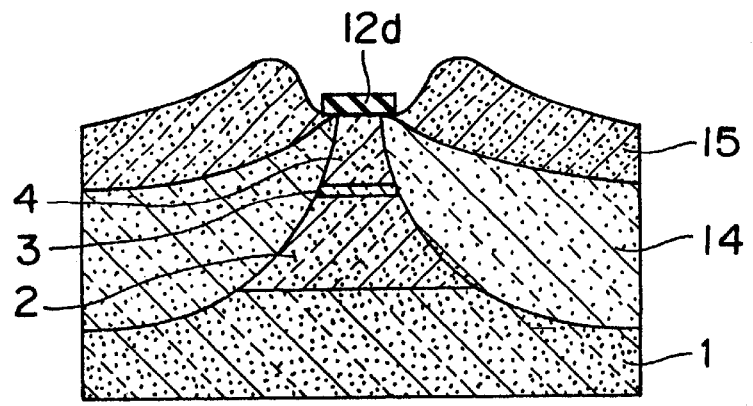
FIG. 6C is a schematic sectional view after growing the embedded layer during the production process of the semiconductor laser diode according to the second embodiment of the present invention.

The oxide mask 12d is used as a selective growth mask for growing the first embedded layer 14 made of semi-insulating InP (Fe-doped InP or the like) or p-InP and the second embedded layer 15 made of n-InP on both sides of the mesa as shown in FIG. 6C.

Thereafter, similar steps as those of the first embodiment are carried out thereby to produce the semiconductor laser diode of the second embodiment.

In the semiconductor laser diode of the second embodiment produced as described above, the mesa is formed by etching with the two-stage mask comprising the oxide mask 12d and the nitride mask 11f that is formed to cover the oxide mask 12d and has the protruding portions 11e protruding beyond the oxide mask 12d, then after the nitride mask 11f is removed by selective etching, the first embedded layer 14 and the second embedded layer 15 are grown. Thus since the protruding portions 11e that impede the growth of the second embedded layer 15 in the vicinity of the mesa are removed, the second embedded layer 15 can be grown up to near the mesa, thereby substantially eliminating the leakage current path.

Also according to the second embodiment, since two types of insulating film mask, the nitride mask 11f and the oxide mask 12d, are formed separately, the insulating film masks can be formed with high precision and, as a result, the mesa can be formed with high precision. According to the second embodiment, accuracy of forming the mesa can be improved further by forming the nitride mask 11f and the oxide mask 12d by dry etching.

Further according to the second embodiment, because the oxide film 12 is formed in contact with the top surface of the semiconductor layer (top surface of the mesa), the mesa 5 can be formed with high precision by etching, similarly to the first embodiment.

Embodiment 3

FIGS. 7A–8C are schematic sectional views showing the steps of the method of producing the semiconductor laser diode according to the third embodiment of the present invention.

Figure 7A:
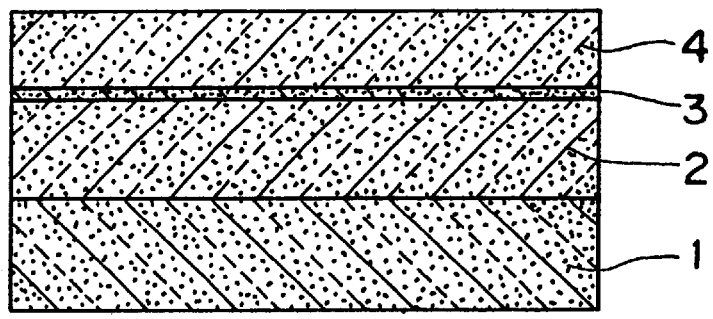
FIG. 7A is a schematic sectional view after growing the cladding layer during the production process of the semiconductor laser diode according to the third embodiment of the present invention
Figure 7B:
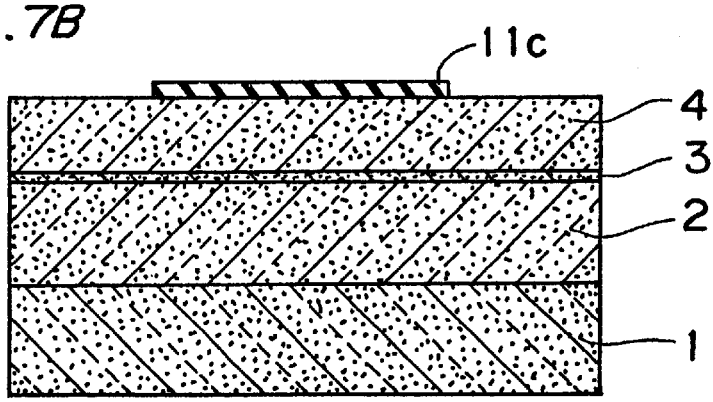
FIG. 7B is a schematic sectional view after forming the nitride film mask during the production process of the semiconductor laser diode according to the third embodiment of the present invention
Figure 7C:
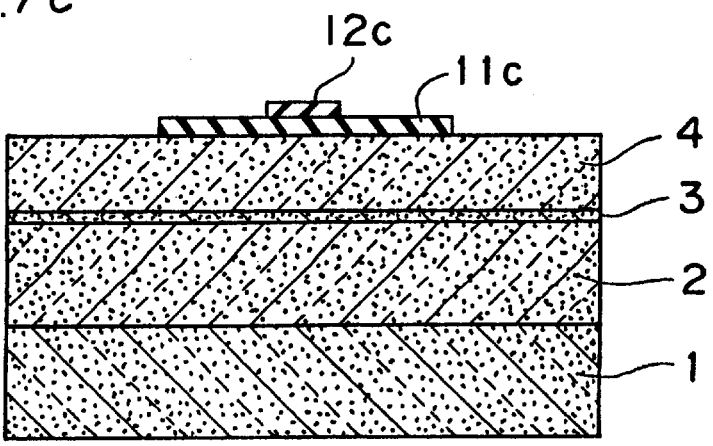
FIG. 7C is a schematic sectional view after forming oxide mask during the production process of the semiconductor laser diode according to the third embodiment of the present invention

In the method of producing the semiconductor laser diode according to the third embodiment, first, the n cladding layer 2 made of n-InP, the active layer 3 and the p cladding layer 4 made of p-InP are formed successively on the substrate 1 made of n-InP as shown in FIG. 7A similarly to the first and the second embodiments. Then a nitride film 11c made of silicon nitride is formed on the p cladding layer 4 that is made of p-InP in a portion where the mesa is to be formed, as shown in FIG. 7B. This is followed by the formation of an oxide film 12c made of $SiO_2$ having width smaller than that of the nitride mask 11c on the nitride mask 11c at the position right above the mesa to be formed as shown in FIG. 7C.

Width of the oxide mask 12c is set so that the flow of stock material gas will not be impeded when growing the first embedded layer 14 made of semi-insulating InP (Fe-doped InP or the like) or p-InP and the second embedded layer 15 made of n-InP. Width of the wider nitride mask 11c is set so as to enable the formation of the mesa having the desired shape, for example, in case the mesa with top surface width of about 1 μm is to be formed, width of the nitride mask 11c is set to 5 to 7 μm.

Figure 8A:
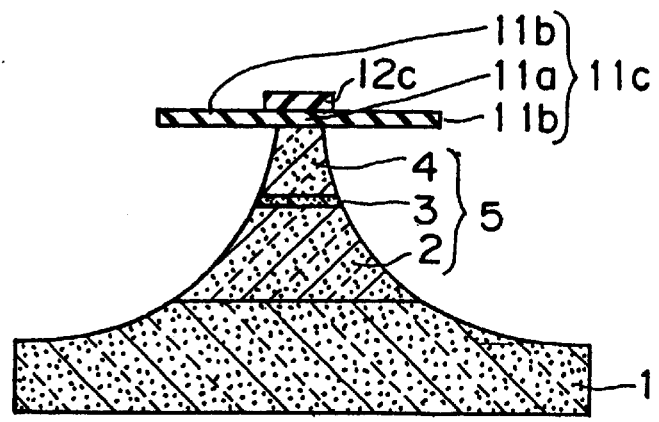
FIG. 8A is a schematic sectional view after etching to form the mesa during the production process of the semiconductor laser diode according to the third embodiment of the present invention.

Next, the two-stage mask comprising the nitride mask 11c and the oxide mask 12c formed on the nitride mask 11c is used in etching to form the mesa 5 shown in FIG. 8A.

Figure 8B:
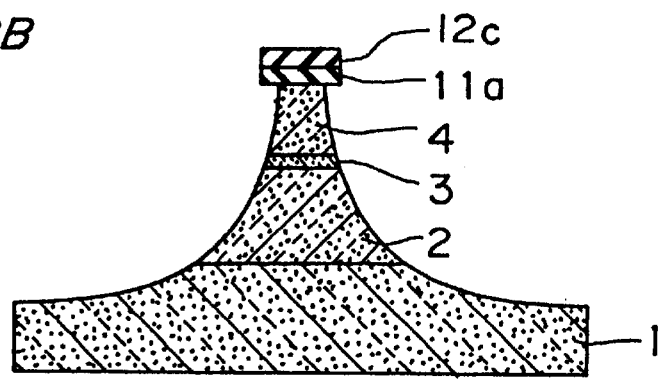
FIG. 8B is a schematic sectional view after removing protruding portions of nitride mask during the production process of the semiconductor laser diode according to the third embodiment of the present invention.

Then protruding portions 11b of the nitride mask 11c protruding beyond the oxide mask 12c are removed as shown in FIG. 8B, by selective etching in a dry etching step such as $CF_4$ plasma etching.

Figure 8C:
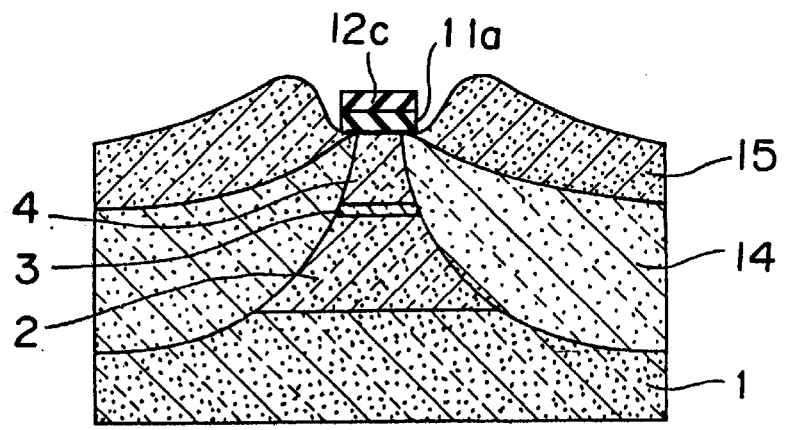
FIG. 8C is a schematic sectional view after growing the embedded layer during the production process of the semiconductor laser diode according to the third embodiment of the present invention.

The nitride mask 11a with the protruding portions 11b removed and the oxide mask 12c are used as selective growth mask for growing the first embedded layer 14 made of semi-insulating InP (Fe-doped InP or the like) or p-InP and the second embedded layer 15 made of n-InP on both sides of the mesa as shown in FIG. 8C.

Thereafter similar steps as those of the first and the second embodiments are carried out to produce the semiconductor laser diode of the third embodiment.

In the semiconductor laser diode of the third embodiment produced as described above, the mesa is formed by etching with the two-stage mask comprising the oxide mask 12c and the nitride mask 11c that has the protruding portions 11b protruding beyond the oxide mask 12c, then after the protruding portions 11b of the nitride mask 11c are removed by selective etching, the first embedded layer 14 and the second embedded layer 15 are grown. Thus since the protruding portions 11b that impede the growth of the second embedded layer 15 in the vicinity of the mesa are removed, the second embedded layer 15 can be grown up to near the mesa, thereby substantially eliminating the leakage current path.

Also according to the third embodiment, since two types of insulating film mask, the nitride mask 11c and the oxide mask 12c, are formed separately, the insulating film masks can be formed with high precision and, as a result, the mesa can be formed with high precision. According to the third embodiment, it is preferable to form both the nitride mask 11c and the oxide mask 12c by dry etching, which improves the accuracy.

Embodiment 4

FIGS. 9A–10C are schematic sectional views showing the steps of the method of producing the semiconductor laser diode according to the fourth embodiment of the present invention.

Figure 9A:
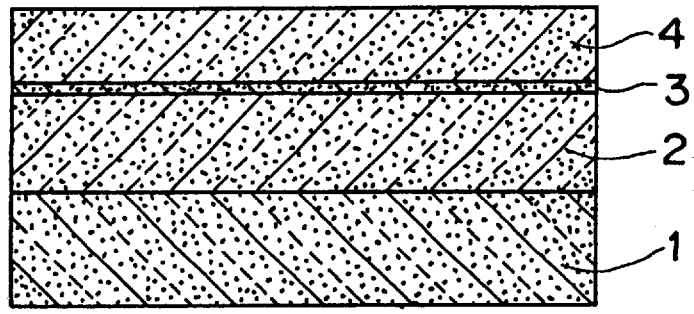
FIG. 9A is a schematic sectional view after growing the cladding layer during the production process of the semiconductor laser diode according to the fourth embodiment of the present invention.
Figure 9B:
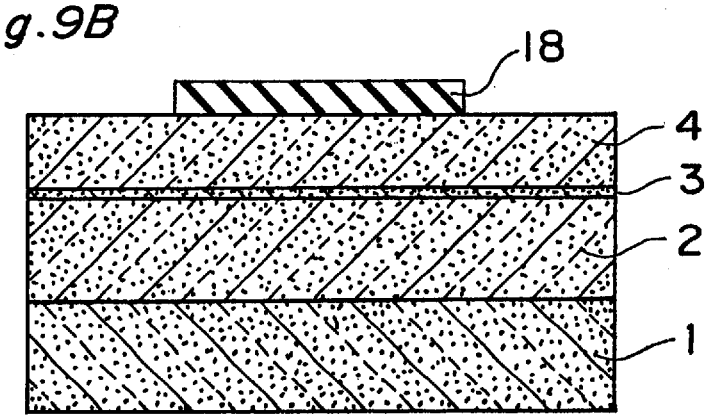
FIG. 9B is a schematic sectional view after forming the insulating film during the production process of the semiconductor laser diode according to the fourth embodiment of the present invention.

In the method of producing the semiconductor laser diode according to the fourth embodiment, first, the n cladding layer 2 made of n-InP, the active layer 3 and the p cladding layer 4 made of p-InP are formed successively on the substrate 1 made of n-InP as shown in FIG. 9A. Then an insulating film made of $SiO_2$ or SiN, for example, is formed on the p cladding layer 4 that is made of p-InP in a portion where the mesa is to be formed, as shown in FIG. 9B. The insulating film 18 is formed so that the width thereof is larger than that of the mesa that is to be formed and the insulating film protrudes substantially evenly to the right and left beyond the edges of the mesa.

Figure 9C:
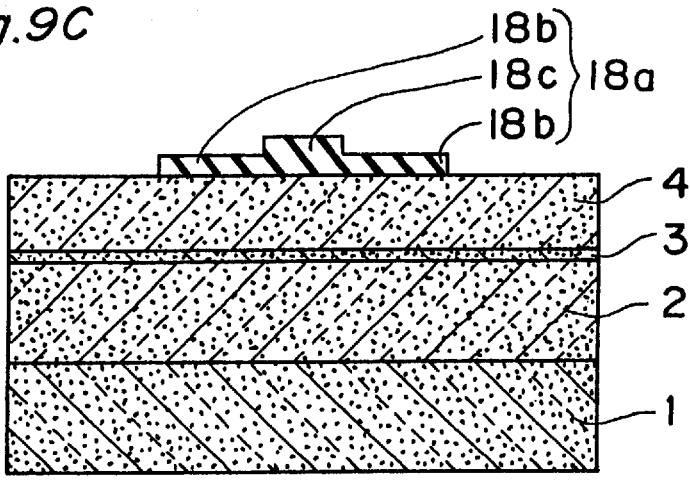
FIG. 9C is a schematic sectional view after removing the insulating film on both sides of the resist film during the production process of the semiconductor laser diode according to the fourth embodiment of the present invention.

Then a resist film is formed on the insulating film 18 right above the mesa to be formed, and the insulating film on both sides of the resist film are removed by etching, thereby shaping the insulating film 18a to have stepped cross section having raised central portion as shown in FIG. 9C. That is, the insulating film 18a consists of a thick portion 18c at the center and thin portions 18b extending therefrom over substantially the same distances on both sides.

Width of the insulating film 18a is made larger than that of the mesa 5 to enable the formation of the mesa 5 having desired oshape. In case the mesa with top surface width of about 1 μm is to be formed, for example, width of the insulating film 18a is set to 5 to 7 μm.

Width of the thick portion 18c, on the other hand, is set so that the flow of stock material gas will not be impeded when growing the first embedded layer 14 made of semi-insulating InP (Fe-doped InP or the like) or p-InP and the second embedded layer 15 made of n-InP.

In case the mesa 5 with top surface width of about 1 μm is to be formed, for example, width of the nitride mask 11 is set to 3 to 4 μm.

Figure 10A:
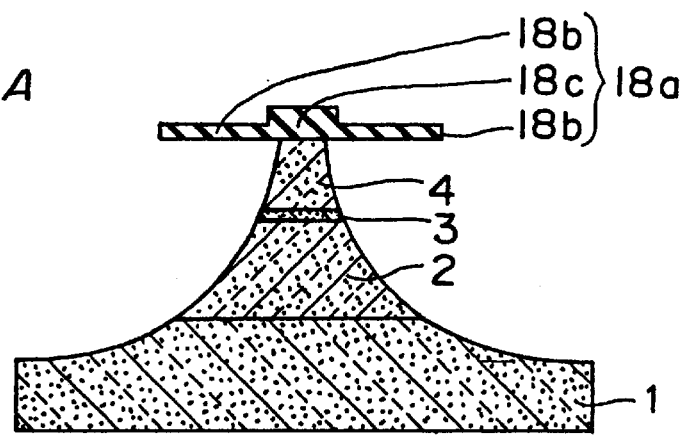
FIG. 10A is a schematic sectional view after etching to form the mesa during the production process of the semiconductor laser diode according to the fourth embodiment of the present invention.

Then as shown in FIG. 10A, the mesa is formed by etching with the insulating film 18a, having stepped cross section with the raised central portion, being used as a mask.

Figure 10B:
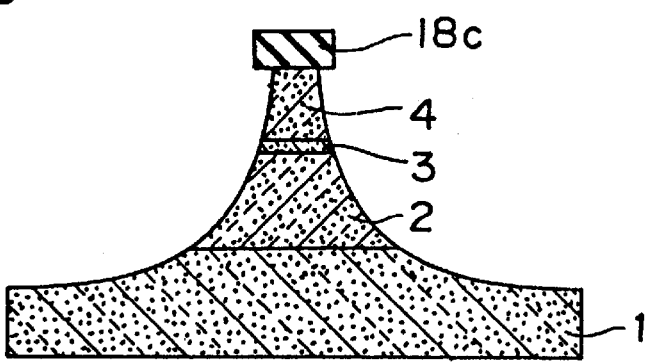
FIG. 10B is a schematic sectional view after removing protruding portions of insulating film during the production process of the semiconductor laser diode according to the fourth embodiment of the present invention.
Figure 10C:
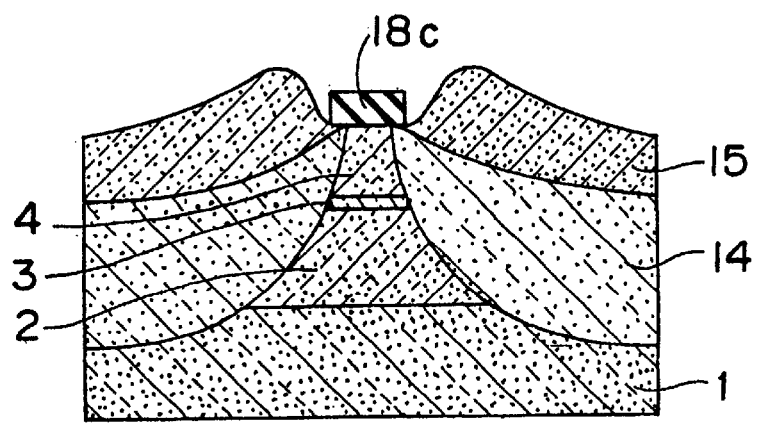
FIG. 10C is a schematic sectional view after growing the embedded layer during the production process of the semiconductor laser diode according to the fourth embodiment of the present invention.

Thereafter, the thin portions 18b of the insulating film mask 18a are removed by wet etching or dry etching as shown in FIG. 10B, then the first embedded layer 14 made of semi-insulating InP (Fe-doped InP or the like) or p-InP and the second embedded layer 15 made of n-InP are grown on both sides of the mesa by using the insulating film, that consists of the thick portion 18c with the thin portions 18b being removed, as the selective growth mask, as shown in FIG. 10C.

The thick portion 18c of the mask on the mesa is then removed by wet etching using hydrofluoric acid or the like, the p-InP layer and the contact layer 17 are formed similarly to the first through the third embodiments and, last, the p electrode is formed thereby making the semiconductor laser diode of the fourth embodiment.

The semiconductor laser diode according to the fourth embodiment produced as described above can be made by using one type of insulating film with effects similar to those of the first and the second embodiments.

Embodiment 5

FIGS. 11A–12C are schematic sectional views showing the steps of the method of producing the semiconductor laser diode according to the fifth embodiment of the present invention.

Figure 11A:
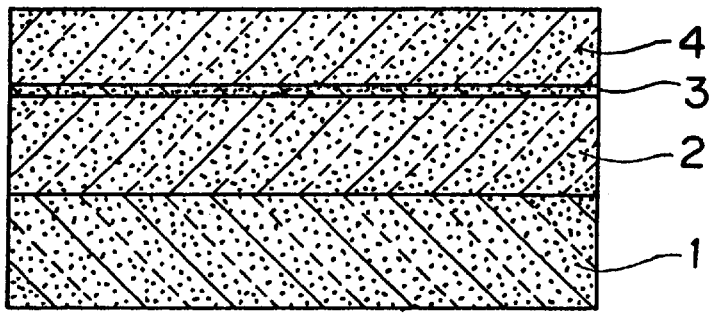
FIG. 11A is a schematic sectional view after growing the cladding layer during the production process of the semiconductor laser diode according to the fifth embodiment of the present invention.
Figure 11B:
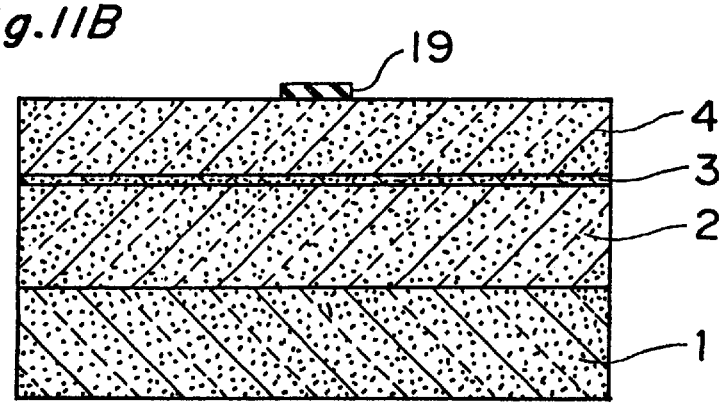
FIG. 11B is a schematic sectional view after forming the insulating film during the production process of the semiconductor laser diode according to the fifth embodiment of the present invention.
Figure 11C:
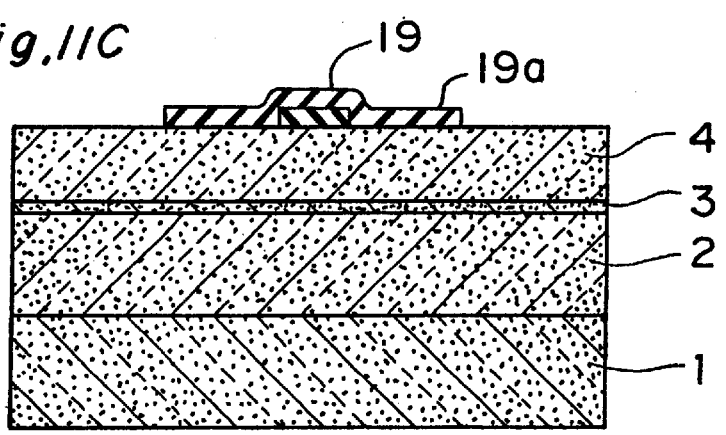
FIG. 11C is a schematic sectional view after forming an insulating film during the production process of the semiconductor laser diode according to the fifth embodiment of the present invention.

In the method of producing the semiconductor laser diode according to the fifth embodiment, first, the n cladding layer 2 made of n-InP, the active layer 3 and the p cladding layer 4 made of p-InP are formed successively on the substrate 1 made of n-InP as shown in FIG. 11A. Then an insulating film 19 made of $SiO_2$, SiN or the like is formed on the p cladding layer 4 that is made of p-InP in a portion where the mesa is to be formed, as shown in FIG. 11B. This is followed by the formation of an insulating film 19a made of the same material as that of the insulating film 19 to cover the insulating film 19. The insulating film 19a is formed so that the width thereof is larger than that of the mesa that is to be formed and the insulating film protrudes substantially evenly to the right and left from the edges of the mesa.

Width of the insulating film 19 is set so that flow of stock material gas will not be impeded when growing the first embedded layer 14 made of semi-insulating InP (Fe-doped InP or the like) or p-InP and the second embedded layer 15 made of n-InP. Width of the wider insulating film 19 is set so as to enable the formation of the mesa having desired shape, for example, in case the mesa with top surface width of about 1 μm is to be formed, width of the insulating film 19 is set to 5 to about 7 μm.

Figure 12A:
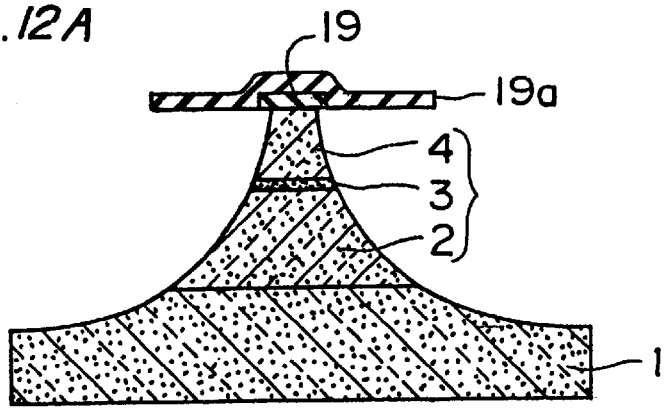
FIG. 12A is a schematic sectional view after etching to form the mesa during the production process of the semiconductor laser diode according to the fifth embodiment of the present invention.
Figure 12B:
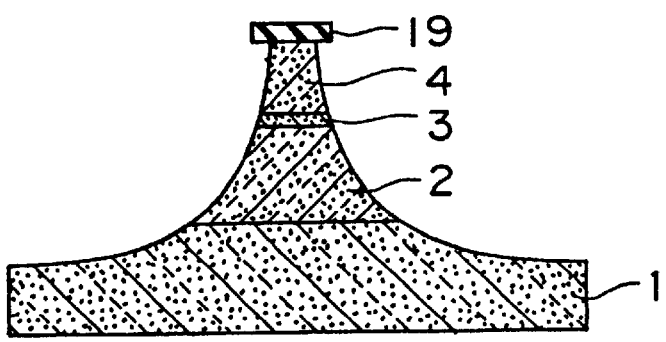
FIG. 12B is a schematic sectional view after removing protruding portions of insulating film during the production process of the semiconductor laser diode according to the fifth emembodiment of the present invention.
Figure 12C:
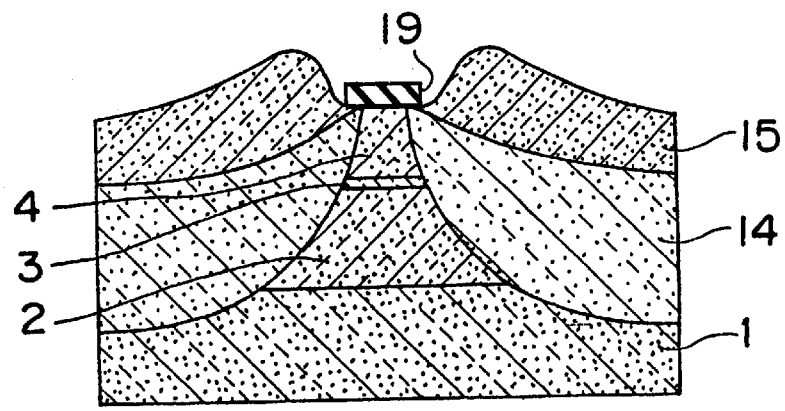
FIG. 12C is a schematic sectional view after growing the embedded layer during the production process of the semiconductor laser diode according to the fifth embodiment of the present invention.

Then as shown in FIG. 12A, the mesa is formed by etching with the two-stage mask comprising the insulating film 19 and the insulating film 19a as the mask. Thereafter, the insulating film 19a is removed by wet etching or dry etching as shown in FIG. 12B, then the first embedded layer 14 made of semi-insulating InP (Fe-doped InP or the like) or p-InP and the second embedded layer 15 made of n-InP are grown on both sides of the mesa by using the insulating film 19 as the selective growth mask, as shown in FIG. 12C.

The insulating film 19 on the mesa is then removed, the p-InP layer and the contact layer 17 are formed similarly to the first through the fourth embodiments and, last, the p electrode is formed thereby making the semiconductor laser diode of the fifth embodiment.

The semiconductor laser diode according to the fifth embodiment produced as described above can be made by using one type of insulating film with effects similar to those of the first and the second embodiments.

Since the insulating film 19 and the insulating film 19a are formed separately, width and thickness of the insulating films can be controlled accurately, thereby forming the mesa with high precision.

Embodiment 6

FIGS. 13A–14C are schematic sectional views showing the steps of the method of producing the semiconductor laser diode according to the sixth embodiment of the present invention.

The production method according to the sixth embodiment is a variation of the production method according to the fourth embodiment wherein an etching stopper layer is provided in the insulating film thereby making it possible to improve the processing accuracy.

Figure 13A:
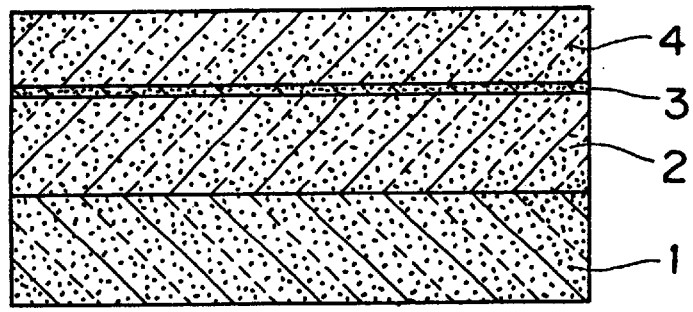
FIG. 13A is a schematic sectional view after growing the cladding layer during the production process of the semiconductor laser diode according to the sixth embodiment of the present invention.
Figure 13B:
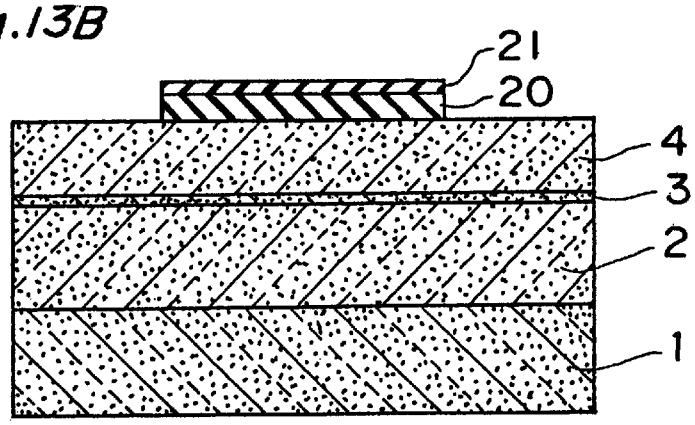
FIG. 13B is a schematic sectional view after forming insulating film 20, 21 during the production process of the semiconductor laser diode according to the sixth embodiment of the present invention.
Figure 13C:
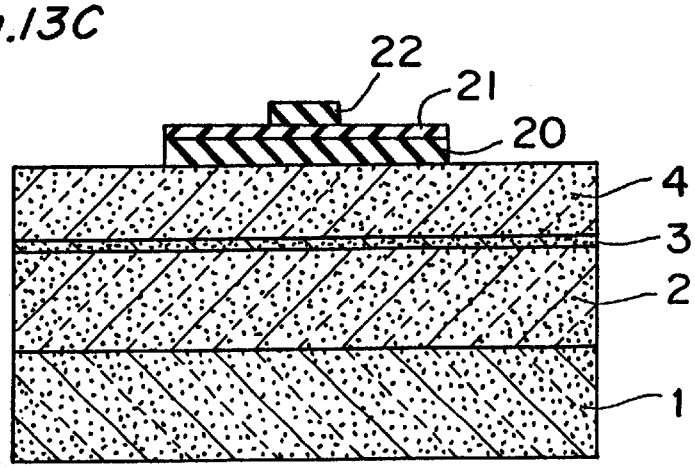
FIG. 13C is a schematic sectional view after forming insulating film 22 during the production process of the semiconductor laser diode according to the sixth embodiment of the present invention.

In the method of producing the semiconductor laser diode according to the sixth embodiment, first, the n cladding layer 2 made of n-InP, the active layer 3 and the p cladding layer 4 made of p-InP are formed successively on the substrate 1 made of n-InP as shown in FIG. 13A. Then two insulating films having different etching rates with regard to dry etching are formed on the p cladding layer 4 that is made of p-InP, and a predetermined resist pattern is formed thereby to form an insulating film 20 and an insulating film 21 that are laminated one on another, as shown in FIG. 13B. The insulating films 20, 21 are formed to be wider than the mesa that is to be formed and protrude to the right and left from the edges of the mesa.

Widths of the insulating films 20, 21 are set so as to enable the formation of the mesa having a desired shape, for example, in case the mesa with top surface width of about 1 μm is to be formed, width of the oxide film mask 12 is set to 5 to about 7 μm.

Then an insulating film different from the insulating film 21 is formed on the insulating film 21 and dry etching is carried out using the resist pattern, to form an insulating film 22 that is narrower than the insulating films 20, 21 over the mesa to be formed. In order for the insulating film 21 to function as an etching stopper layer, a material having a lower etching rate than the insulating film 22 with regard to dry etching is used for the insulating film 21. Width of the insulating film 22 is set so that the flow of stock material gas will not be impeded when growing the first embedded layer 14 made of semi-insulating InP (Fe-doped InP or the like) or p-InP and the second embedded layer 15 made of n-InP.

Figure 14A:
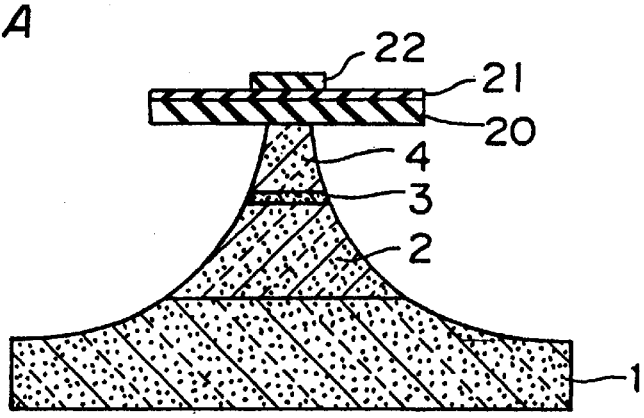
FIG. 14A is a schematic sectional view after etching to form the mesa during the production process of the semiconductor laser diode according to the sixth embodiment of the present invention.
Figure 14B:
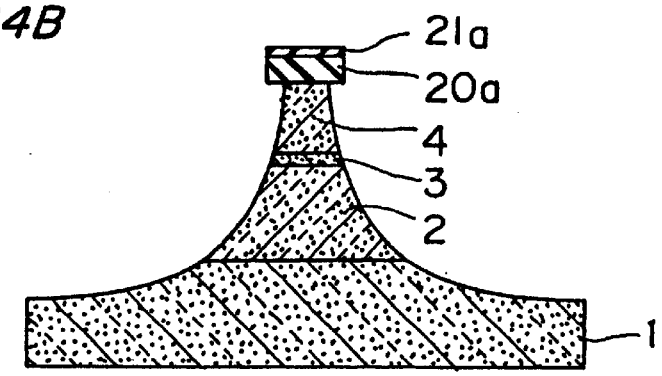
FIG. 14B is a schematic sectional view after removing protruding portions of insulating film during the production process of the semiconductor laser diode according to the sixth embodiment of the present invention.

Then the mesa is formed by etching with a stepped triple-layer insulating film comprising the insulating films 20, 21, 22 used as a mask as shown in FIG. 14A.

Figure 14C:
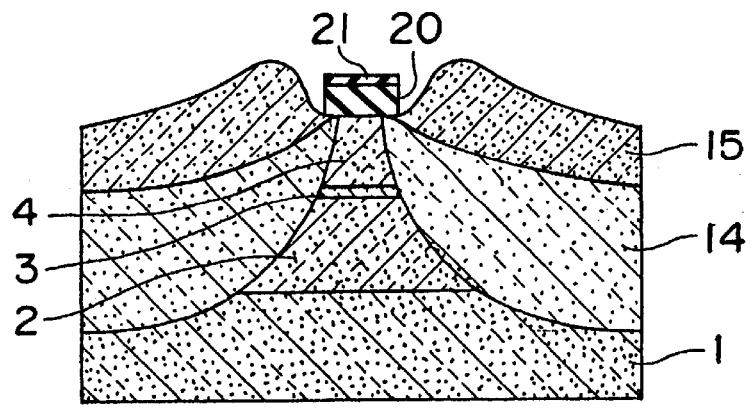
FIG. 14C is a schematic sectional view after growing the embedded layer during the production process of the semiconductor laser diode according to the sixth embodiment of the present invention.

Next, the insulating films 20, 21 located on both sides of the insulating film 22 and the insulating film 22 are removed by wet etching or dry etching. Then the insulating film comprising the remainder of the insulating film 20a and insulating film 21a are used as a selective growth mask, as shown in FIG. 14C, to grow the first embedded layer 14 made of semi-insulating InP (Fe-doped InP or the like) or p-InP and the second embedded layer 15 made of n-InP on both sides of the mesa. The insulating films 20a, 21a on the mesa are then removed, the p-InP layer and the contact layer 17 are formed similarly to the foregoing embodiments and, last, the p electrode is formed thereby making the semiconductor laser diode of the sixth embodiment.

The semiconductor laser diode according to the sixth embodiment produced as described above has effects similar to those of the first through the fifth embodiments. Also since the semiconductor laser diode according to the sixth embodiment employs the etching stopper layer, the insulating film 20 can be protected from being etched when etching the insulating film 22 into a desired shape, thus maintaining the shape (particularly the width) of the insulating film 20. This makes it possible to form the insulating films more precisely and, in turn, to form the mesa with high accuracy.

In the method of producing the semiconductor laser diode according to the sixth embodiment, it is preferable to use SiN for the insulating film 20,22 and $SiO_2$ for the insulating film 21. Use of $SiO_2$ for the insulating film 20 that is in contact with the semiconductor layer allows it to prevent a bottle neck described in conjunction with the first embodiment from being formed in the mesa, thus forming the mesa of the desired configuration with high accuracy. Also with the insulating film 21 that serves as the etching stopper layer being formed from SiN, it functions effectively as the etching stopper layer for the insulating layer 20 made of $SiO_2$.

Embodiment 7

Figure 15:
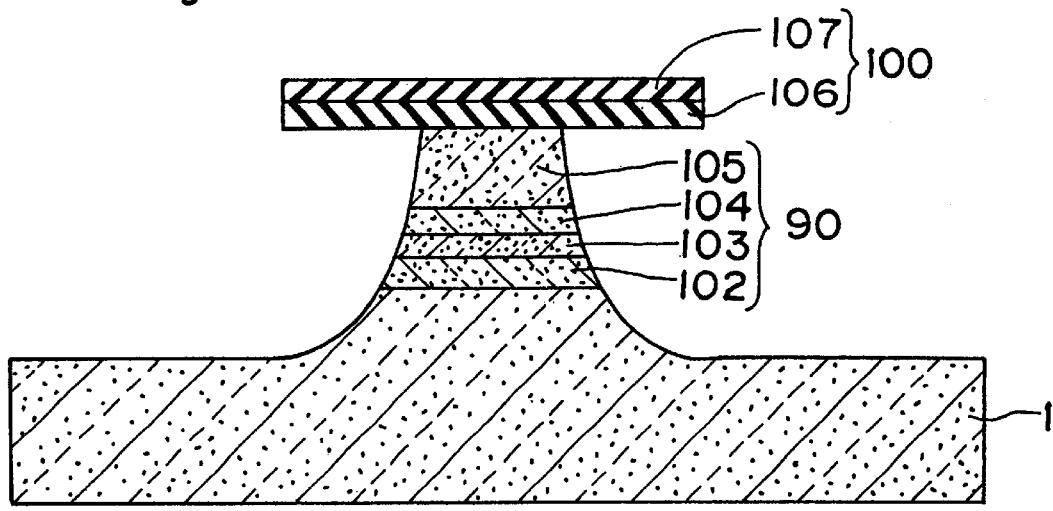
FIG. 15 is a schematic sectional view after forming the selective growth mask during the production process of the semiconductor laser diode according to the seventh embodiment of the present invention.
Figure 16:
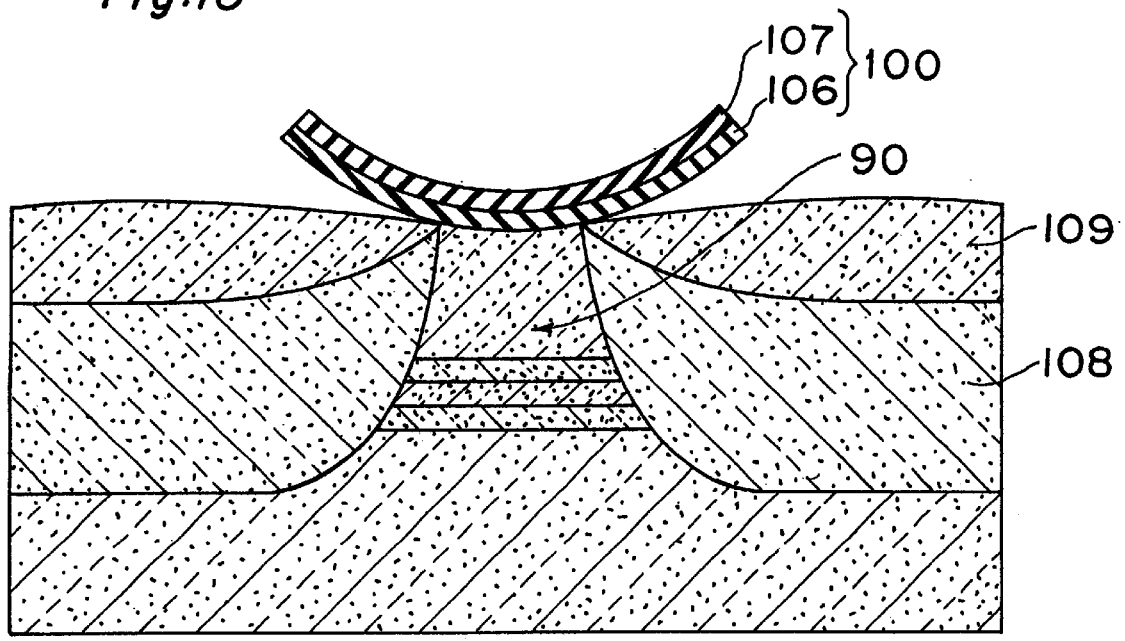
FIG. 16 is a schematic sectional view when the embedded layer is growing during the production process of the semiconductor laser diode according to the seventh embodiment of the present invention.

The semiconductor laser diode according to the seventh embodiment is produced by, after etching to form a mask with a selective growth mask 100 of double-layer structure made by laminating an insulating film 106 and an insulating film 107 having thermal expansion coefficient lower than that of the insulating film 106 as shown in FIG. 15, the selective growth mask 100 is used to form the first embedded layer 108 made of p-InP and the second embedded layer 109 made of n-InP on both sides of the mesa as shown in FIG. 16. Since this configuration causes the first embedded layer 108 made of p-InP and the second embedded layer 109 to grow at a high temperature, the selective growth mask 100 of double-layer structure warps to expand the space of the embedding portion around the mesa as shown in FIG. 16 thus allowing the stock material gas to be supplied sufficiently to the space around the mesa. This makes it possible, in the semiconductor laser diode according to the seventh embodiment, to grow the first and second embedded layers, particularly the second embedded layer 109, to a sufficient thickness of 0.3 μm or greater in the vicinity of the mesa, thus minimizing the leakage current.

In case the first embedded layer 108 made of p-InP and the second embedded layer 109 made of n-InP are grown by metal organic chemical vapor deposition (MOCVD) technique, the growing temperature is set to 600 to 700° C. In the seventh embodiment, for example, $SiO_2$ (thermal expansion coefficient $5 \times 10^{-7°}$ $C.^{-1}$) can be used for the insulating film 106, and $Si_2N_3$ (thermal expansion coefficient $4 \times 10^{-7°}$ $C.^{-1}$) can be used for the insulating film 107.

In FIG. 15 and FIG. 16, numeral 1 denotes a substrate made of n-InP, 102 denotes an n-InGaAsP light confinement layer, 103 denotes an InGaAsP-MQW quantum well active layer, 104 denotes an undoped InGaAsP light confinement layer and 105 denotes a p-InP first cladding layer.

The method of producing the semiconductor laser diode according to the seventh embodiment will be described below with reference to FIGS. 17A–18C in the sequential order of the steps.

Figure 17A:
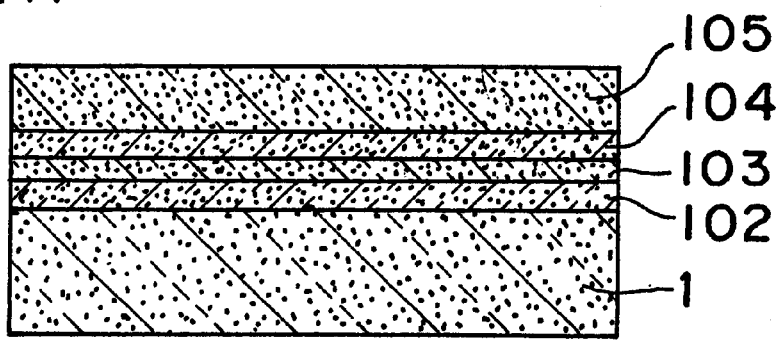
FIG. 17A is a schematic sectional view after growing a p-InP first cladding layer during the production process of the semiconductor laser diode according to the seventh embodiment of the present invention.
Figure 17B:
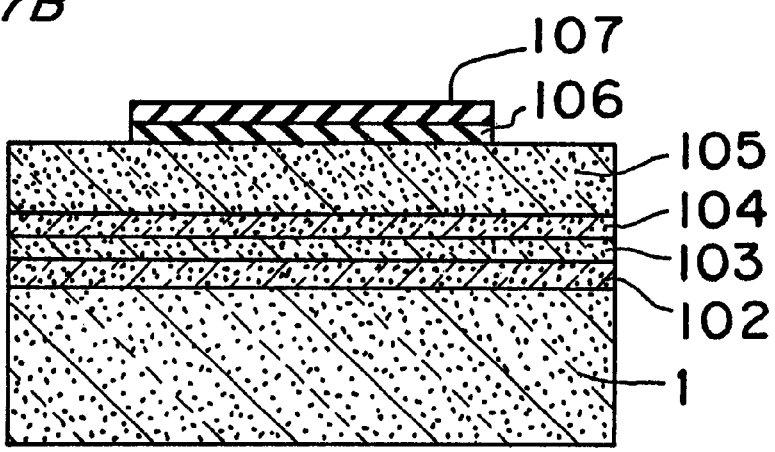
FIG. 17B is a schematic sectional view after forming insulating films during the production process of the semiconductor laser diode according to the seventh embodiment of the present invention.

According to this production method, the n-InGaAsP light confinement layer 102, the InGaAsP-MQW quantum well active layer 103, the undoped InGaAsP light confinement layer 104 and the p-InP first cladding layer 105 are formed on the substrate 1 as shown in FIG. 17A.

Next, after forming an insulating film of $SiO_2$ and an insulating film $Si_2N_3$ on the p-InP first cladding layer 105 by sputtering or CVD process, the insulating films are etched into a predetermined shape by wet etching or dry etching thereby to form the selective growth mask 100 comprising the first insulating film 106 made of $SiO_2$, and the second insulating film 107 made of $Si_2N_3$ laminated on one on another.

Figure 17C:
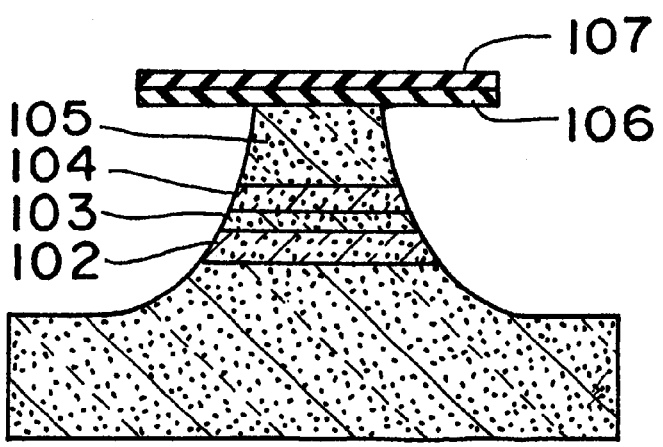
FIG. 17C is a schematic sectional view after etching to form the mesa during the production process of the semiconductor laser diode according to the seventh embodiment of the present invention.

Then wet etching is carried out by using HBr to form a mesa 90 that serves as an optical waveguide as shown in FIG. 17C.

Figure 18A:
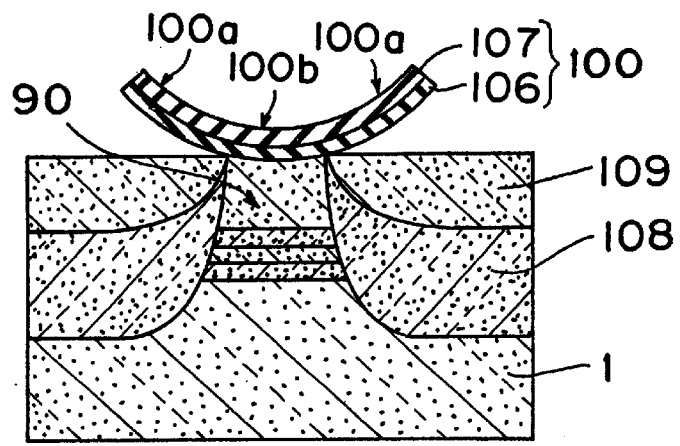
FIG. 18A is a schematic sectional view when the embedded layer is growing during the production process of the semiconductor laser diode according to the seventh embodiment of the present invention.

The selective growth mask 100 of double-layer structure comprising the first insulating film 106 and the second insulating film 107 being laminated one on another is used to grow the first embedded layer 108 made of p-InP and the second embedded layer 109 made of n-InP by metal organic chemical vapor deposition (MOCVD) technique as shown in FIG. 18A. Since the growing temperature with the MOCVD process is set to 500 to 700° C., the selective growth mask 100 warps during growth due to the difference in the thermal expansion coefficient between the first insulating film 106 and the second insulating film 107, so that the space between the substrate 1 and the protruding portions 100a of the selective growth mask 100 is expanded. Since this makes it possible to supply the stock material gas sufficiently to around the mesa for forming the first embedded layer 108 and the second embedded layer 109, the first embedded layer 108 and the second embedded layer 109 can be formed with a sufficient thickness of 0.3 μm or larger up to the vicinity of the mesa. According to the present invention, thickness of each of the first insulating film 106 and the second insulating film 107 that constitute the selective growth mask 100 of double-layer structure is preferably set to 500 to 2000 Å in order to effectively achieve the operation/working effect of the selective growth mask and the effects of the present invention.

Figure 18B:
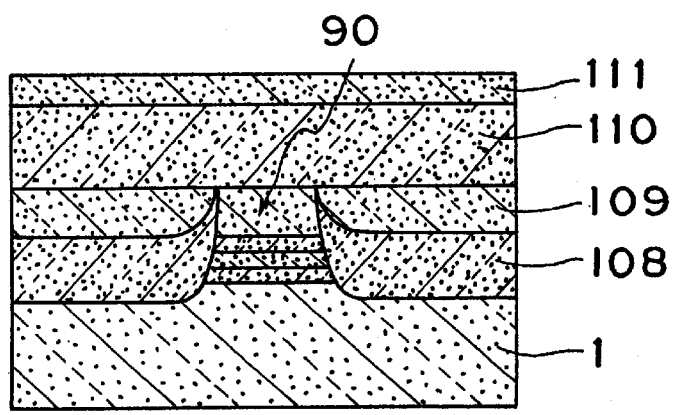
FIG. 18B is a schematic sectional view after growing a contact layer during the production process of the semiconductor laser diode according to the seventh embodiment of the present invention.

After growing the layers, the selective growth mask 100 is removed by wet etching or dry etching and, as shown in FIG. 18B, a p-InP second cladding layer 110 and a $p^+$-InGaAs contact layer 111 are formed successively by MOCVD process.

After forming an insulating film 112 made of $SiO_2$ or SiN on the $p^+$-InGaAs contact layer 111 by sputtering or CVD process, the insulating film is removed from over the mesa which should be connected with an electrode.

Figure 18C:
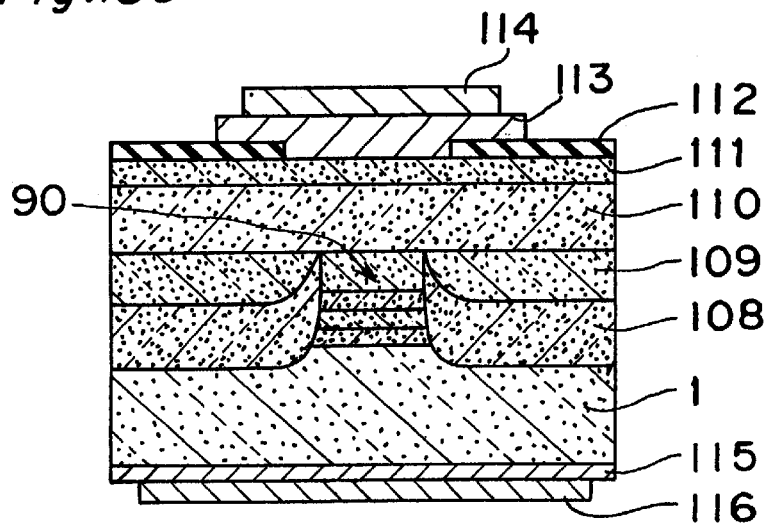
FIG. 18C is a schematic sectional view after forming the electrode during the production process of the semiconductor laser diode according to the seventh embodiment of the present invention.
Figure 19:
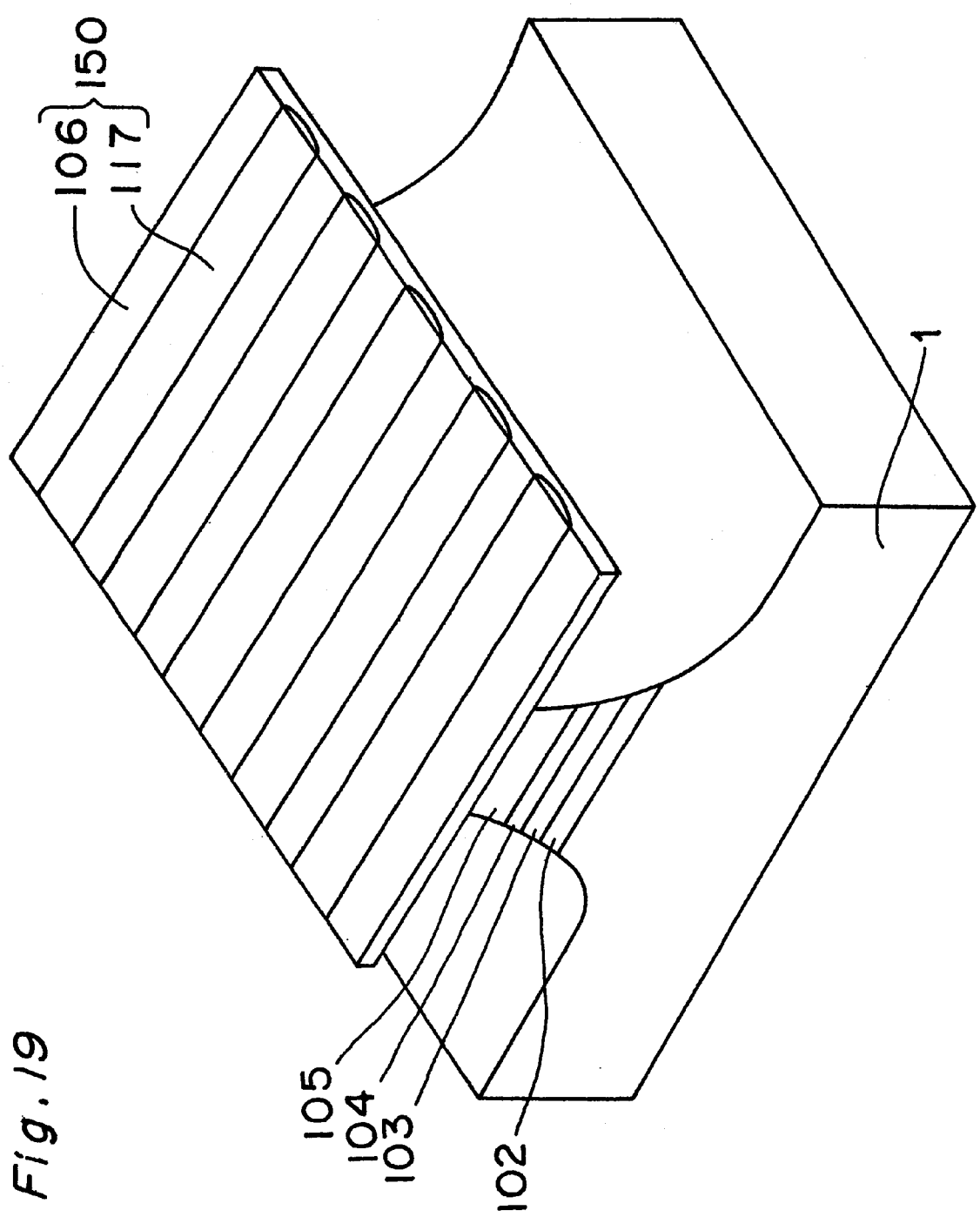
FIG. 19 is a perspective view showing a selective growth mask during the production process of the semiconductor laser diode according to the eighth embodiment of the present invention.

Then as shown in FIG. 18C, a Ti/Au-deposited electrode 113 m that makes contact with the $p^+$-InGaAs contact layer 111 is formed in an aperture formed in the insulating film and an Au-plated electrode 114 to serve as a surface electrode (p electrode) is formed on the deposited electrode 113, followed by the formation of an AuGe/Ni/Ti/Pt/Au-deposited electrode 115 and an Au-plated electrode 116 as n electrodes.

In the semiconductor laser diode according to the seventh embodiment produced by the method described above, since the p-InP embedded layer 108 and the n-InP embedded layer 109 can be formed with a sufficient thickness of 0.3 μm or greater up to near the mesa, leakage current path can be prevented from being formed thus minimizing the leakage current.

In the semiconductor laser diode according to the seventh embodiment, since the selective growth mask 100 comprising the insulating film 106 and the insulating film 107 having different thermal expansion coefficients is used, the selective growth mask 100 warps so that the space between the substrate 1 and the protruding portions 100a of the selective growth mask 100 expands when growing the p-InP embedded layer 108 and the n-InP embedded layer 109 by MOCVD process. Consequently, the stock material gas for forming the p-InP embedded layer 108 and the n-InP embedded layer 109 can be supplied sufficiently to around the mesa, thus making it possible to form the p-InP embedded layer 108 and the n-InP embedded layer 109 with a sufficient thickness of 0.3 μm or larger up to the vicinity of the mesa.

Materials having different thermal expansion coefficients 1are used to form the insulating film 106 and the insulating film 107 in the seventh embodiment, but the present invention is not limited to this configuration, and such a selective growth mask of double-layer structure may be used that consists of two films formed from an identical material but are made to have different amounts of deformation produced in the films when growing the crystal thereby giving different thermal expansion coefficients.

When forming a selective growth mask from SiN, for example, the first insulation mask may be formed from SiN by plasma CVD process and the second insulation mask may be formed from SiN by high-temperature thermal CVD process. This configuration makes it possible to differentiate the amount of deformation produced in the first insulation mask formed from SiN by plasma CVD process and the amount of deformation produced in the second insulation mask formed from SiN by high-temperature thermal CVD process, thus achieving effects similar to those of the seventh embodiment.

Embodiment 8

The semiconductor laser diode according to the eighth embodiment is produced similarly to the seventh embodiment except that a selective growth mask 150 is used instead of the selective growth mask 100 in the production method of the seventh embodiment.

Figure 20:
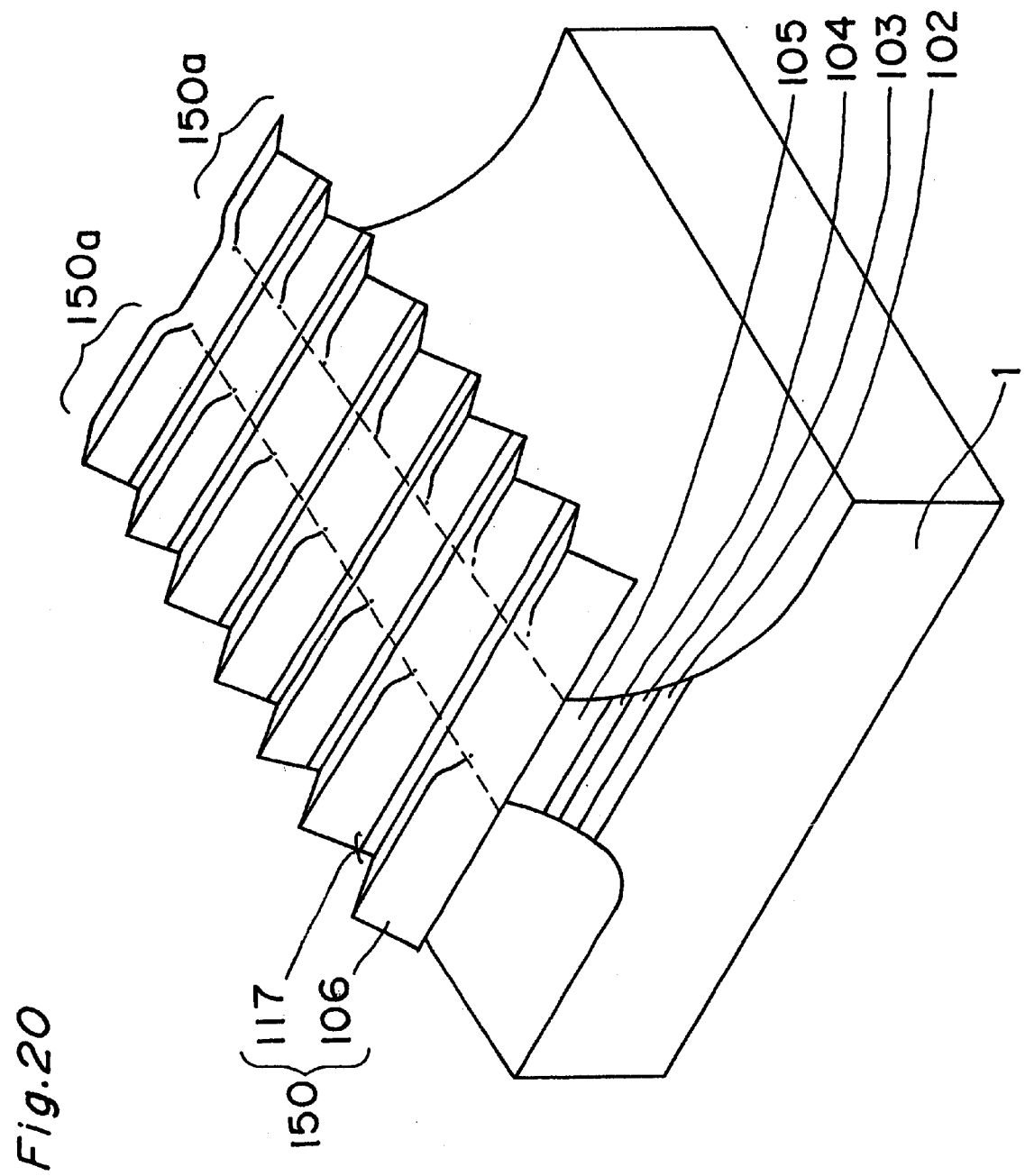
FIG. 20 is a perspective view showing a selective growth mask in selective growth during the production process of the semiconductor laser diode according to the eighth embodiment of the present invention.
Figure 21:
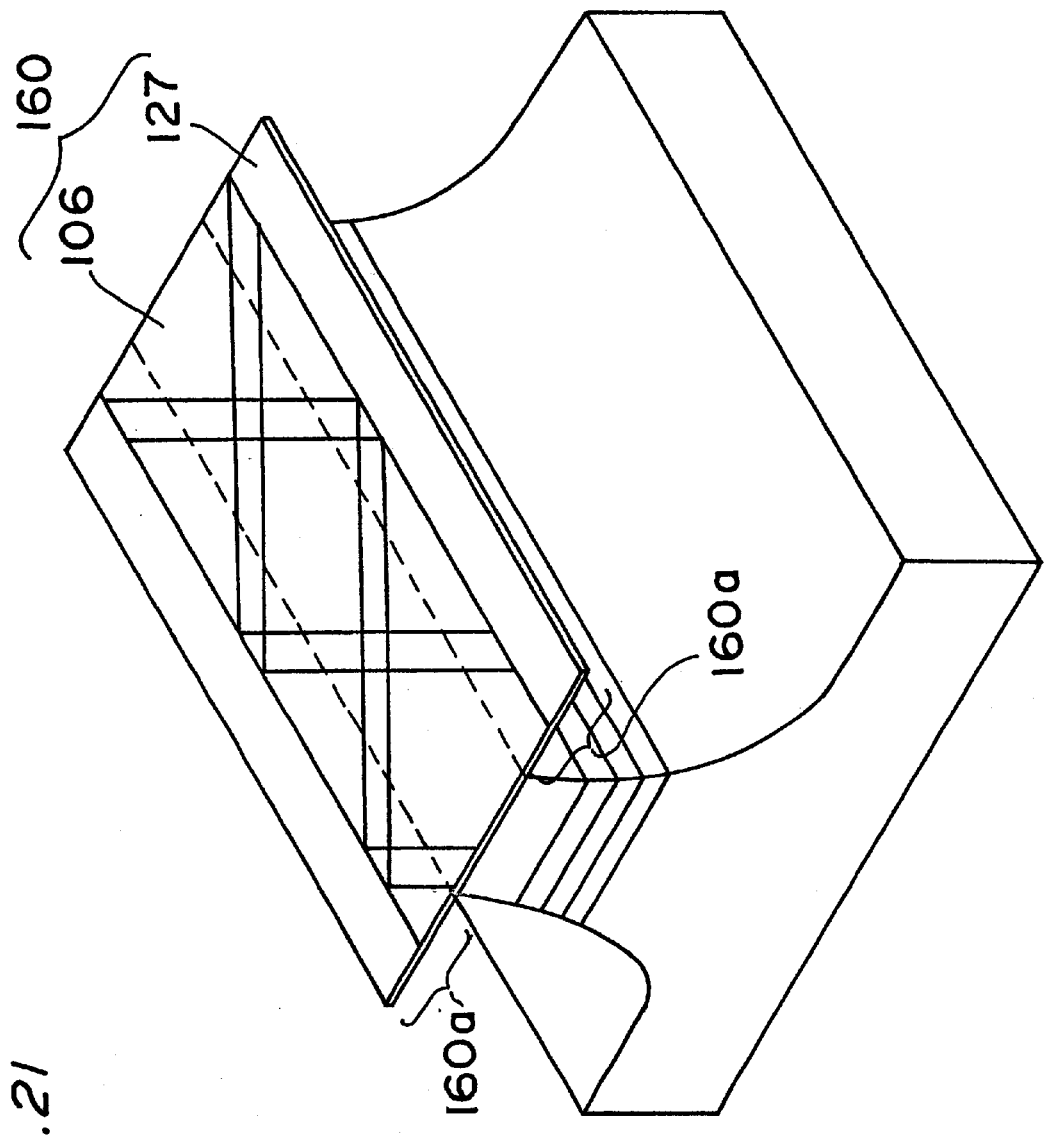
FIG. 21 is a perspective view showing a selective growth mask during the production process of the semiconductor laser diode according to the ninth embodiment of the present invention.

Specifically, according to the method of producing the semiconductor laser diode of the eighth embodiment, the selective growth mask 150 is made by forming a plurality of insulating films 117 spaced at predetermined intervals with the longitudinal direction thereof arranged at right angles with the longitudinal direction of the mesa on the insulating film 106. In case the thermal expansion coefficient is made different between the insulating film 106 and the insulating film 107 in the selective growth mask 150 that is made as described above, the selective growth mask 150 is deformed in an undulating configuration as shown in FIG. 20 due to the difference in the thermal expansion coefficient between the insulating film 106 and the insulating film 107 at the growth temperature when forming the p-InP embedded layer 108 and the n-InP embedded layer 109 by the MOCVD process.

This deformation makes it possible to prevent the protruding portions 150a from sagging toward the substrate 1 in the selective growth mask 150 when forming the first embedded layer 108 and the second embedded layer 109, thereby preventing the space between the substrate 1 and the protruding portions 150a of the selective growth mask 150 from decreasing. This makes it possible to supply the stock material gas for forming the first embedded layer 108 and the second embedded layer 109 sufficiently to around the mesa, thus making it possible to form the first embedded layer 108 and the second embedded layer 109 with a sufficient thickness of 0.3 μm or larger up to the vicinity of the mesa.

According to the eighth embodiment, the insulating film 106 may be made of $SiO_2$ and the insulating film 117 may be made of $Si_2N_3$. However, accordingtothepresent invention, acombination of insulation materials having different thermal expansion coefficients may be used, or alternatively the insulating films may also be made of the same material with the thermal expansion coefficients differentiated by producing different amounts of internal deformation during growth.

Also according to the eighth embodiment, the insulating film 106 and the insulating film 117 may be made of the same material having the same thermal expansion coefficient. That is, in such a configuration as the film thickness varies periodically, less deformation due to thermal expansion is caused in thick portions and larger deformation due to thermal expansion is caused in thin portions, resulting in the undulating configuration as shown in FIG. 20 thereby achieving effects similar to those of the eighth embodiment.

Embodiment 9

The semiconductor laser diode according to the ninth embodiment is produced similarly to the seventh embodiment except that a selective growth mask 160 is used instead of the selective growth mask 100 in the production method of the seventh embodiment.

Specifically, according to the method of producing the semiconductor laser diode of the ninth embodiment, the selective growth mask 160 is made by forming an insulating film 127 having a pattern of grating or mesh on the insulating film 106. In the selective growth mask 160 that is made as described above, since the thickness is greater in the portions where the insulating film 127 is formed on the insulating film 106, the selective growth mask 160 can be prevented from deforming at the growth temperature when growing the first embedded layer 108 and the second embedded layer 109 by the MOCVD process.

Thus it is made possible to prevent the protruding portions 160a from sagging toward the substrate 1 in the selective growth mask 160 when forming the first embedded layer 108 and the second embedded layer 109, thereby preventing the space between the substrate 1 and the protruding portions 160a of the selective growth mask from decreasing. This makes it possible to supply the stock material gas for forming the first embedded layer 108 and the second embedded layer 109 sufficiently to around the mesa, thus making it possible to form the first embedded layer 108 and the second embedded layer 109 with a sufficient thickness of 0.3 μm or larger up to the vicinity of the mesa.

According to the ninth embodiment, the insulating film 106 may be made of $SiO_2$ and the insulating film 127 may be made of $Si_2N_3$, although the insulating films may also be made of the same material having the same thermal expansion coefficient. That is, it suffices to form the insulating films in such a configuration that the thicker portions are prevented from deforming due to heat such as grating or mesh.

Embodiment 10

The semiconductor laser diode according to the tenth embodiment is produced by, after growing the first embedded layer 108 using a selective growth mask, removing the selective growth mask, growing a second embedded layer on the top surface and etching the entire surface uniformly, thereby forming the second embedded layer 109 of a desired thickness.

Specifically, similarly to the seventh embodiment, the n-InGaAsP light confinement layer 102, the InGaAsP-MQW quantum well active layer 103, the undoped InGaAsP light confinement layer 104 and the p-InP first cladding layer 105 are formed on the substrate 1 made of n-InP.

Figure 22A:
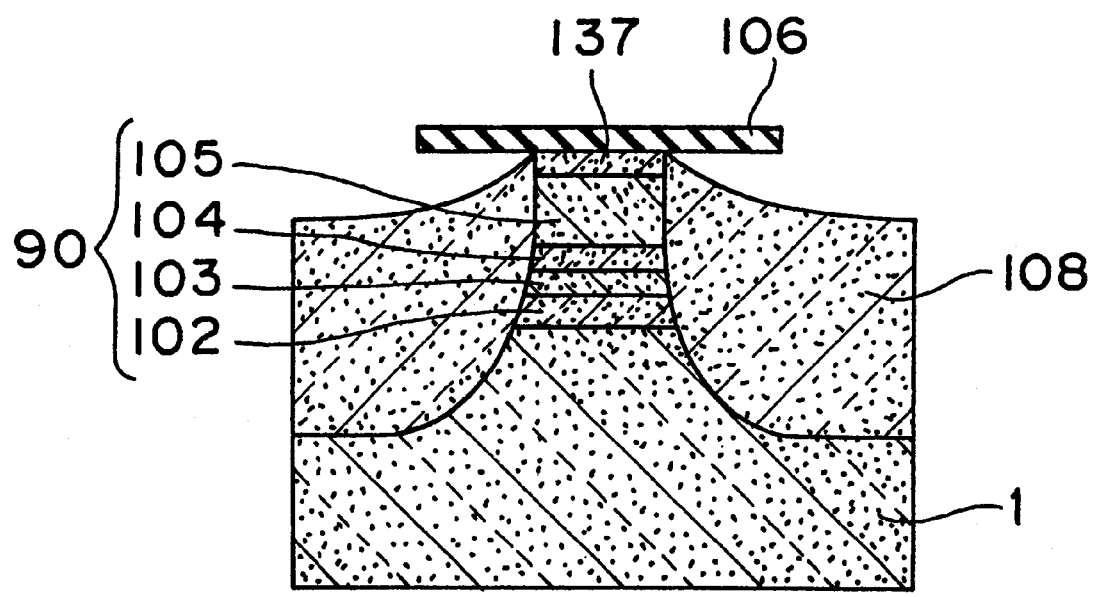
FIG. 22A is a schematic sectional view after forming an insulating film during the production process of the semiconductor laser diode according to the tenth embodiment of the present invention.

Then, in the tenth embodiment, an additional layer made of, for example, InAlAs that will become an etching stopper layer 137 is formed as shown in FIG. 22A.

Next, after forming an insulating film of SiO$_2$ on the InAlAs layer by sputtering or CVD process, the insulating film is etched into a predetermined shape by wet etching or dry etching thereby to form the insulating film 106 made of SiO$_2$, which is used as a mask for etching the mesa.

After forming the mesa by etching, the insulating film 106 is used as a selective growth mask to grow the first embedded layer 108 by the MOCVD process as shown in FIG. 22A.

Figure 22B:
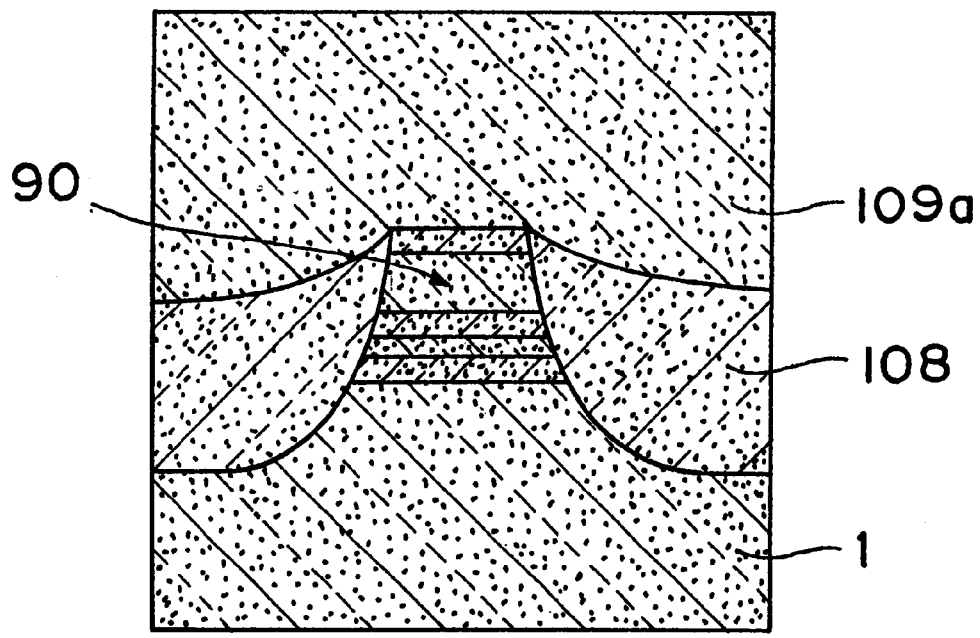
FIG. 22B is a schematic sectional view after growing the second embedded layer during the production process of the semiconductor laser diode according to the tenth embodiment of the present invention.

The insulating film 106 used as the selective growth mask is then removed and a second embedded layer 109a is grown to such a thickness as the entire top surface becomes substantially flat as shown in FIG. 22B.

Figure 23A:
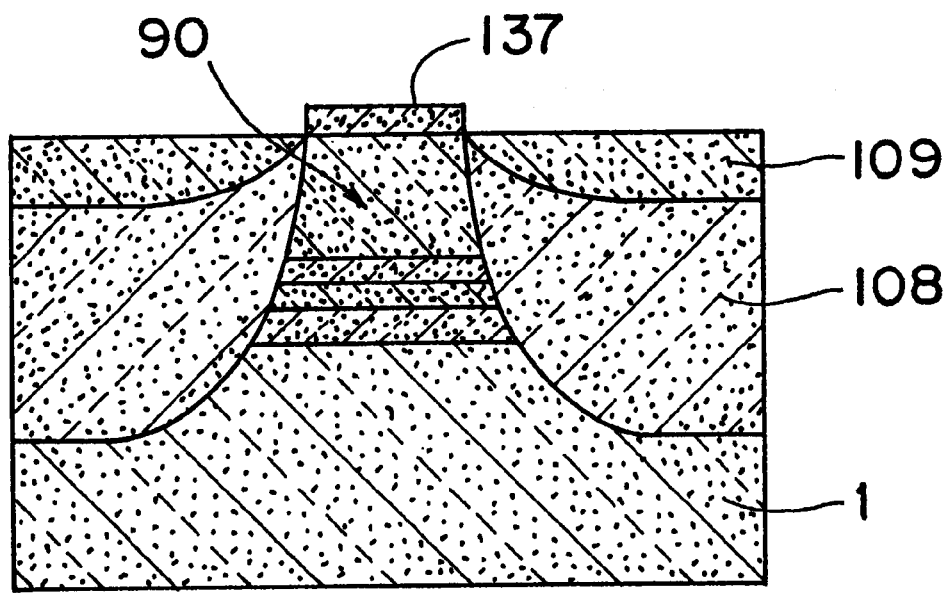
FIG. 23A is a schematic sectional view after etching the second embedded layer during the production process of the semiconductor laser diode according to the tenth embodiment of the present invention.

Then as shown in FIG. 23A, the second embedded layer 109a is etched with a uniform etching rate from above until the top surface of the etching stopper layer 137 is exposed.

In case n-InP is used for the second embedded layer in the present invention, dry etching with a mixture gas of CH$_4$, O$_2$ and H$_2$ can be employed in the etching of the second embedded layer 109a from above. With this etching step, uniform etching rate in the direction of thickness can be achieved relatively easily.

Figure 23B:
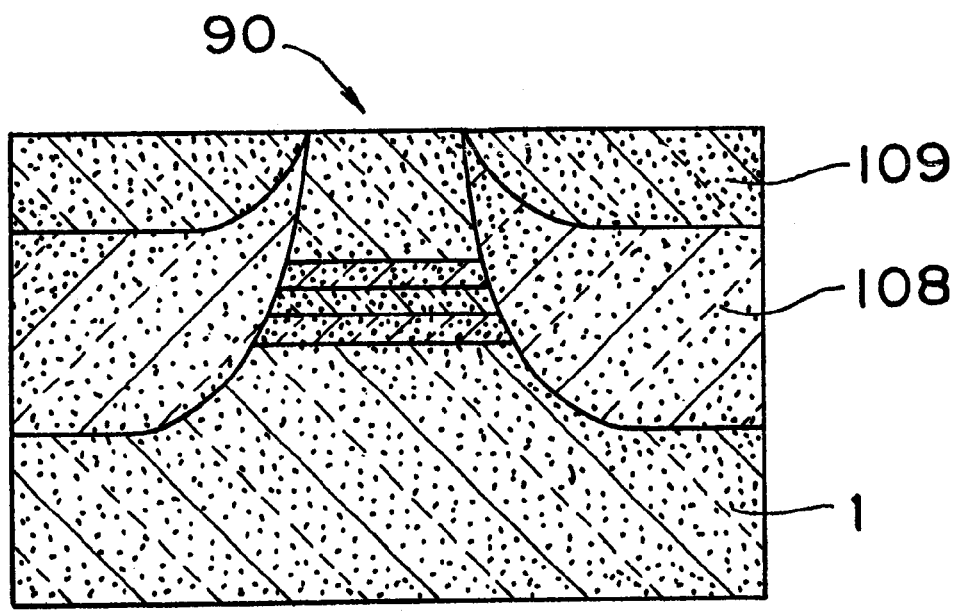
FIG. 23B is a schematic sectional view after removing an etching stopper layer during the production process of the semiconductor laser diode according to the tenth embodiment of the present invention.

Then as shown in FIG. 23B, the etching stopper layer 137 is removed by using HF, for example, and similar processes as those of the eighth embodiment are carried out to complete the semiconductor laser diode of the tenth embodiment.

In the production method according to the tenth embodiment, since the second embedded layer 109 is formed by growing the n-InP embedded layer 109a and etching it from above after removing the selective growth mask, the second embedded layer 109 can be formed with a sufficient thickness of 0.3 μm or greater up to near the mesa.

The production method according to the tenth embodiment may be applied not only to the case of double-layer structure of the first embedded layer and the second embedded layer, but also to an embedded layer of single-layer or triple-layer structure.

While the etching stopper layer 137 is formed in the tenth embodiment, the present invention is not limited to this, and the semiconductor laser diode may be produced without forming the etching stopper layer 137.

Embodiment 11

Figure 24:
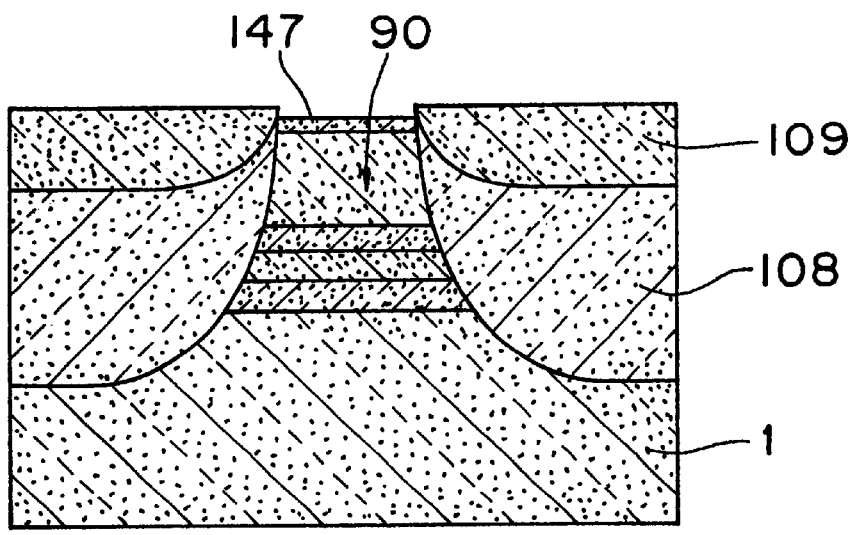
FIG. 24 is a schematic sectional view showing major steps during the production process of the semiconductor laser diode according to the eleventh embodiment of the present invention.
Figure 25:
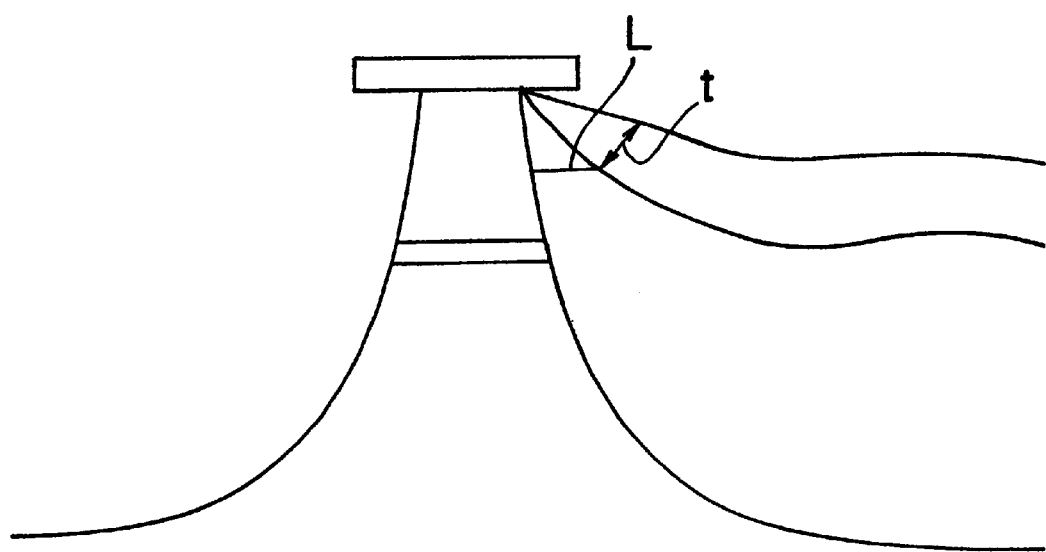
FIG. 25 is a schematic sectional view showing the construction of the semiconductor laser diode according to the present invention.
Figure 26A:
FIG. 26A is a schematic sectional view after growing p-cladding layer during the production process of the semiconductor laser diode according to the first conventional example.
Figure 26B:
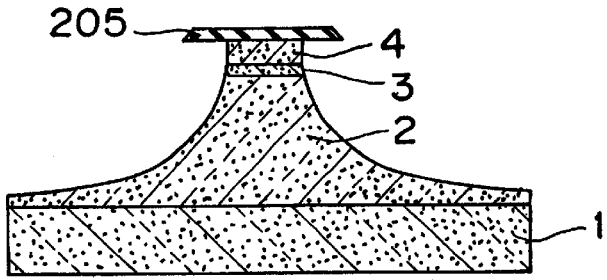
FIG. 26B is a schematic sectional view after forming the mesa during the production process of the semiconductor laser diode according to the first conventional example.
Figure 26C:
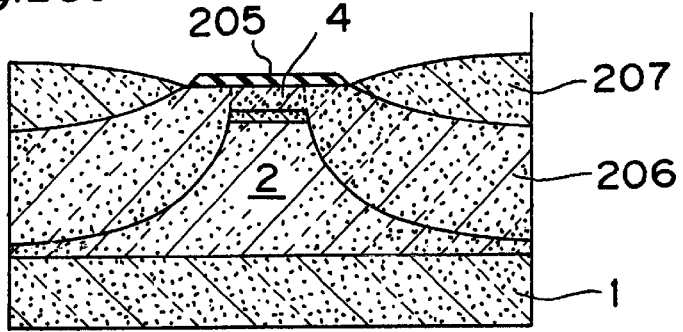
FIG. 26C is a schematic sectional view after growing the embedded layer during the production process of the semiconductor laser diode according to the first conventional example.
Figure 26D:
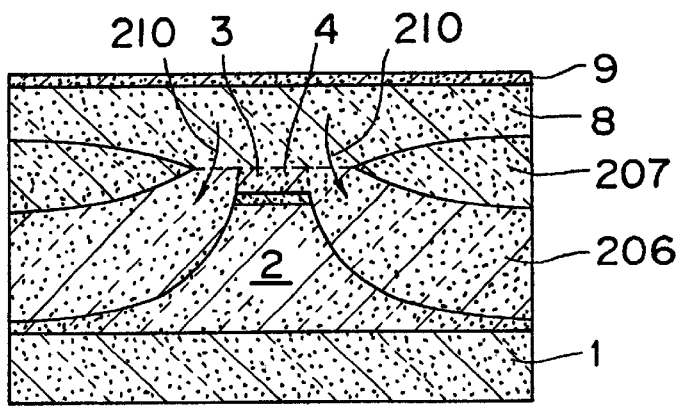
FIG. 26D is a schematic sectional view after growing contact layer during the production process of the semiconductor laser diode according to the first conventional example.
Figure 27A:
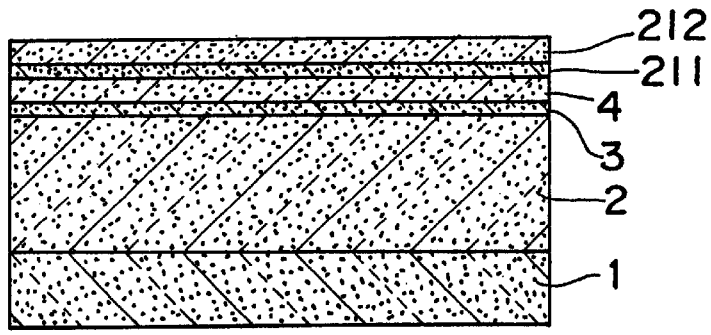
FIG. 27A is a schematic sectional view after forming an oxide film during the production process of the semiconductor laser diode according to the second conventional example.
Figure 27B:
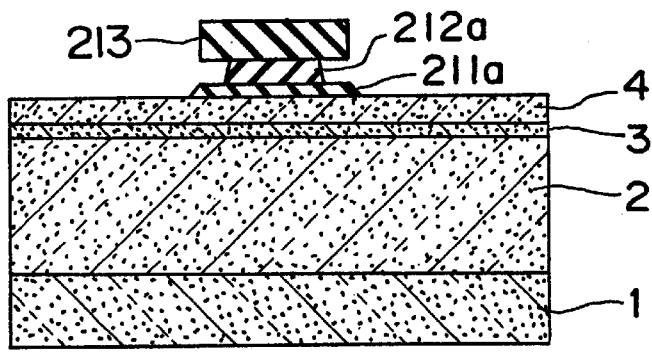
FIG. 27B is a schematic sectional view after forming a photosensitive film 213 during the production process of the semiconductor laser diode according to the second conventional example.
Figure 27C:
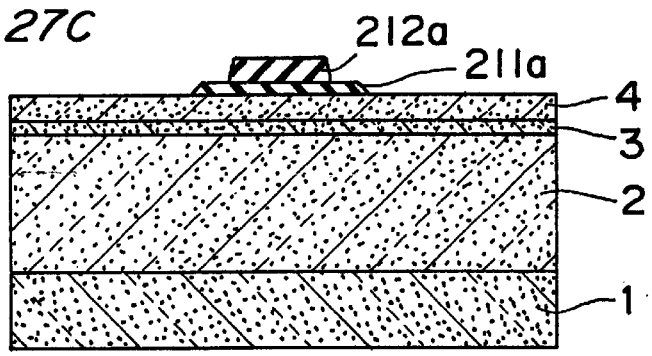
FIG. 27C is a schematic sectional view after removing the photosensitive film during the production process of the semiconductor-laser diode according to the second conventional example.
Figure 27D:
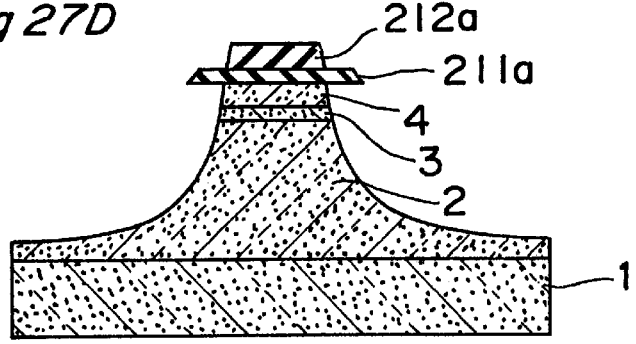
FIG. 27D is a schematic sectional view after forming the mesa during the production process of the semiconductor laser diode according to the second conventional example.
Figure 28A:
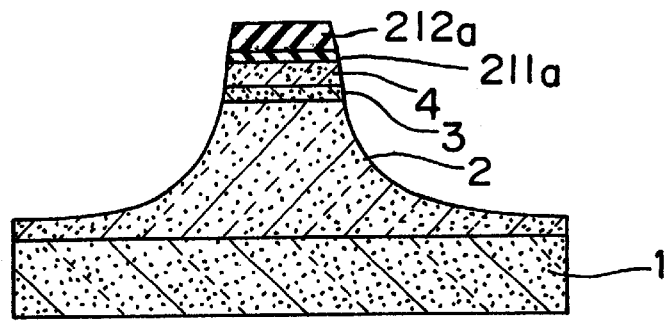
FIG. 28A is a schematic sectional view after removing protruding portions during the production process of the latter half of the semiconductor laser diode according to the second conventional example.
Figure 28B:
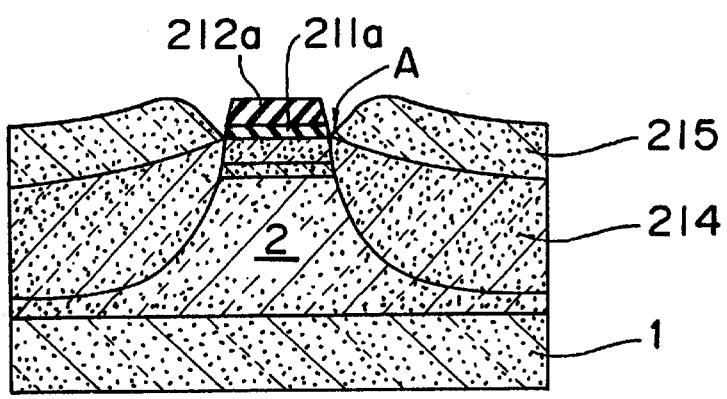
FIG. 28B is a schematic sectional view after growing the embedded layer during the production process of the latter half of the semiconductor laser diode according to the second conventional example.
Figure 28C:
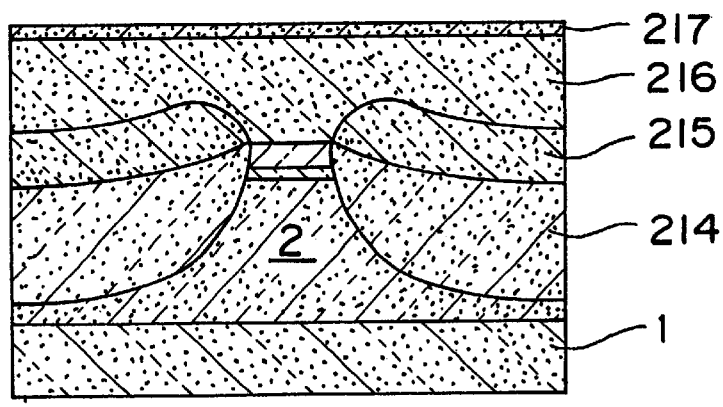
FIG. 28C is a schematic sectional view after growing contact layer during the production process of the latter half of the semiconductor laser diode according to the second conventional example.

While the etching of the second embedded layer 109a is controlled by means of the etching stopper layer 137 that has a slow etching rate in the tenth embodiment, an etching accelerating layer of higher etching rate is used instead of the etching stopper layer 137 as shown in FIG. 24 in the eleventh embodiment.

That is, in the eleventh embodiment, when etching the p-InP embedded layer 109a, etching of the layer 147 proceeds rapidly when the etching step reaches the layer 147 that has a higher etching rate and the etching rate decreases when the surface of the cladding layer 105 is reached, upon which the etching step is terminated.

Thereafter, similar steps as those of the tenth embodiment are carried out to complete the semiconductor laser diode of the eleventh embodiment.

In the eleventh embodiment, HBr or HCl can be used to etch the p-InP embedded layer 109a. In this case, InGaAsP or InGaAs may be used for the layer 147 of high etching rate.

Width of the selective growth mask in the seventh through eleventh. embodiments is set so that the mesa of the desired shape can be formed. In case the mesa with top surface width of about 1 μm is to be formed, for example, width of the selective growth mask is set to 5 to 7 μm.

In the semiconductor laser diode according to the embodiments described above, since the second embedded layers 15, 109 can be formed on the first embedded layers 14, 108 to make contact with the entire surface of the first embedded layers 14, 108 as described above, leakage current path can be prevented from being formed thus minimizing the leakage current. Also when the distance L from the side face of the mesa is 1 μm, for example, thickness of the second embedded layer can be made 0.3 μm or greater. Thus in the semiconductor laser diode according to the embodiments described above, since the relatively thick second embedded layer is formed, leakage current can be decreased further.

While the preferred embodiments described above involve the formation of the current block layer comprising the first embedded layer and the second embedded layer, the present invention is not limited to a semiconductor laser diode having a current block layer comprising two embedded layers, and may be applied to a semiconductor laser diode having three or more embedded layers. Also the preferred embodiments except for the tenth embodiment and the eleventh embodiment can be applied to a case of current block layer comprising a single embedded layer.

While the preferred embodiments have been described with regard to the semiconductor layers such as the substrate 1, the first embedded layer and the second embedded layer taking reference to specific compositions, the present invention is not limited to these embodiments and can be applied to any semiconductor laser diode that has a mesa formed from one or more semiconductor layers on a substrate and is made by growing embedded layers on both sides of the mesa.

What is claimed is:

1. A method of producing a semiconductor laser diode having a mesa with a width and a current blocking layer grown on both sides of the mesa, the method comprising:
   forming a two-stage mask comprising a first mask of SiO$_2$ contacting a top semiconductor layer of semiconductor layers laminated on a semiconductor substrate and a second mask of SiN on said first mask and having a width different from that of the first mask;
   forming a mesa by etching the semiconductor layers at both sides of said two-stage mask;
   forming a selective growth mask by etching said two-stage mask so said selective growth mask has a width equal to the smaller of the widths of said first mask and said second mask; and
   selectively growing a current blocking layer at both sides of said selective growth mask.

2. The method of producing a semiconductor laser diode according to claim 1, wherein said first mask is wider than said second mask.

3. The method of producing a semiconductor laser diode according to claim 1, wherein said first mask is narrower than said second mask.

4. A method of producing a semiconductor laser diode having a mesa with a width and a current blocking layer grown on both sides of said mesa, the method comprising:
   forming a selective growth mask on a top semiconductor layer of semiconductor layers laminated on a semiconductor substrate and forming a material section on at least part of said mask, said material section having a lower thermal expansion coefficient than said mask;
   forming a mesa by etching the semiconductor layers at both sides of said mask; and with said mask overhanging said mesa, raising the temperature of the laminated semiconductor layers and said mask, whereby the mask and the material section warp so that ends of said mask and said material section move away from said semiconductor substrate and, while said mask is warped, selectively growing a current blocking layer on said mesa at both sides of said mesa.

5. The method of producing a semiconductor laser diode according to claim 4, wherein said material section covers substantially all of a surface of said mask.

6. A method of producing a semiconductor laser diode having a mesa with a width and a current blocking layer grown on both sides of said mesa, the method comprising forming a selective growth mask by forming a mask on said mesa and forming a different material section in part of said mask, said different material section including a plurality of strips that are parallel to each other and are at right angles to direction of resonance of the semiconductor laser diode, said different material section having a thermal expansion coefficient different from that of said mask.

7. A method of producing a semiconductor laser diode having a mesa with a width and a current blocking layer having first and second embedded layers grown on both sides of the mesa, the method comprising:
　　forming a first embedded layer on both sides of a mesa using a selective growth mask;
　　removing said selective growth mask after forming said first embedded layer;
　　growing a second semiconductor layer to a thickness to produce a substantially flat surface, on the mesa and on said first embedded layer on both sides of the mesa, after removing the selective growth mask; and
　　forming a second embedded layer on said first embedded layer on both sides of the mesa by etching said second semiconductor layer until the mesa is exposed.

8. The method of producing a semiconductor laser diode according to claim 7, further comprising forming an etching stopping layer on the mesa before forming said first embedded layer.

9. The method of producing a semiconductor laser diode according to claim 7, further comprising forming an etching accelerating layer on the mesa before forming said first embedded layer.

* * * * *